US011404465B2

(12) United States Patent
Lee et al.

(10) Patent No.: US 11,404,465 B2
(45) Date of Patent: Aug. 2, 2022

(54) EPITAXIAL SEMICONDUCTOR LINER FOR ENHANCING UNIFORMITY OF A CHARGED LAYER IN A DEEP TRENCH AND METHODS OF FORMING THE SAME

(71) Applicant: Taiwan Semiconductor Manufacturing Company Limited, Hsinchu (TW)

(72) Inventors: Ru-Liang Lee, Hsinchu (TW);
Yu-Hung Cheng, Tainan (TW);
Yeur-Luen Tu, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 186 days.

(21) Appl. No.: 16/901,036

(22) Filed: Jun. 15, 2020

(65) Prior Publication Data
US 2021/0391362 A1 Dec. 16, 2021

(51) Int. Cl.
*H01L 27/146* (2006.01)
(52) U.S. Cl.
CPC ...... *H01L 27/1463* (2013.01); *H01L 27/1464* (2013.01); *H01L 27/14603* (2013.01); *H01L 27/14612* (2013.01); *H01L 27/14621* (2013.01); *H01L 27/14685* (2013.01); *H01L 27/14689* (2013.01)
(58) Field of Classification Search
None
See application file for complete search history.

(56) References Cited

U.S. PATENT DOCUMENTS

| | | | |
|---|---|---|---|
| 6,495,411 B1 * | 12/2002 | Mei | H01L 27/1087 438/386 |
| 8,354,675 B2 * | 1/2013 | Kwon | H01L 29/66181 257/E27.092 |
| 10,090,287 B1 * | 10/2018 | Adusumilli | H01L 21/324 |
| 2006/0014343 A1 * | 1/2006 | Kundalgurki | H01L 21/32134 257/E21.309 |
| 2012/0086064 A1 * | 4/2012 | Cheng | H01L 21/84 438/389 |
| 2019/0181174 A1 * | 6/2019 | Fang | H01L 27/14629 |

* cited by examiner

*Primary Examiner* — Ali Naraghi
(74) *Attorney, Agent, or Firm* — The Marbury Law Group, PLLC

(57) ABSTRACT

Photodetectors, transistors, and metal interconnect structures may be formed on a front side of the semiconductor substrate. A trench is formed through a backside surface of the semiconductor substrate toward the front side by an anisotropic etch process, which provides a vertical or tapered surface with a first root-mean-square surface roughness greater than 0.5 nm. A single crystalline semiconductor liner is deposited by performing an epitaxial growth process at a growth temperature less than 500 degrees Celsius on the vertical or tapered surface of the trench. A physically exposed side surface of the single crystalline semiconductor liner may have a second root-mean-square surface roughness less than 0.5 nm. At least one dielectric metal oxide liner having a uniform thickness may be formed on the physically exposed side surface to provide a uniform negatively charged film, which may be advantageously used to reduce dark current and white pixels.

20 Claims, 17 Drawing Sheets

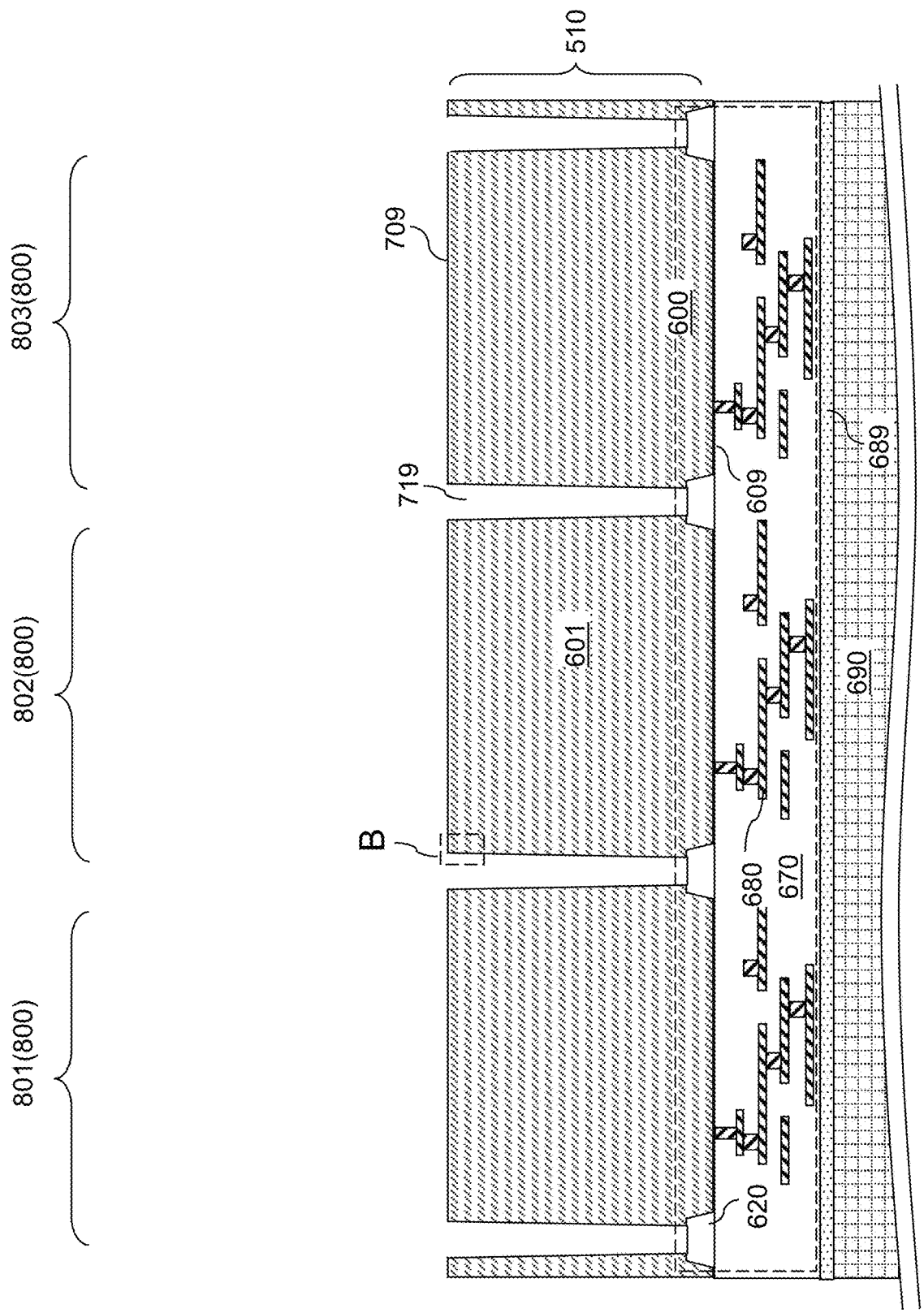

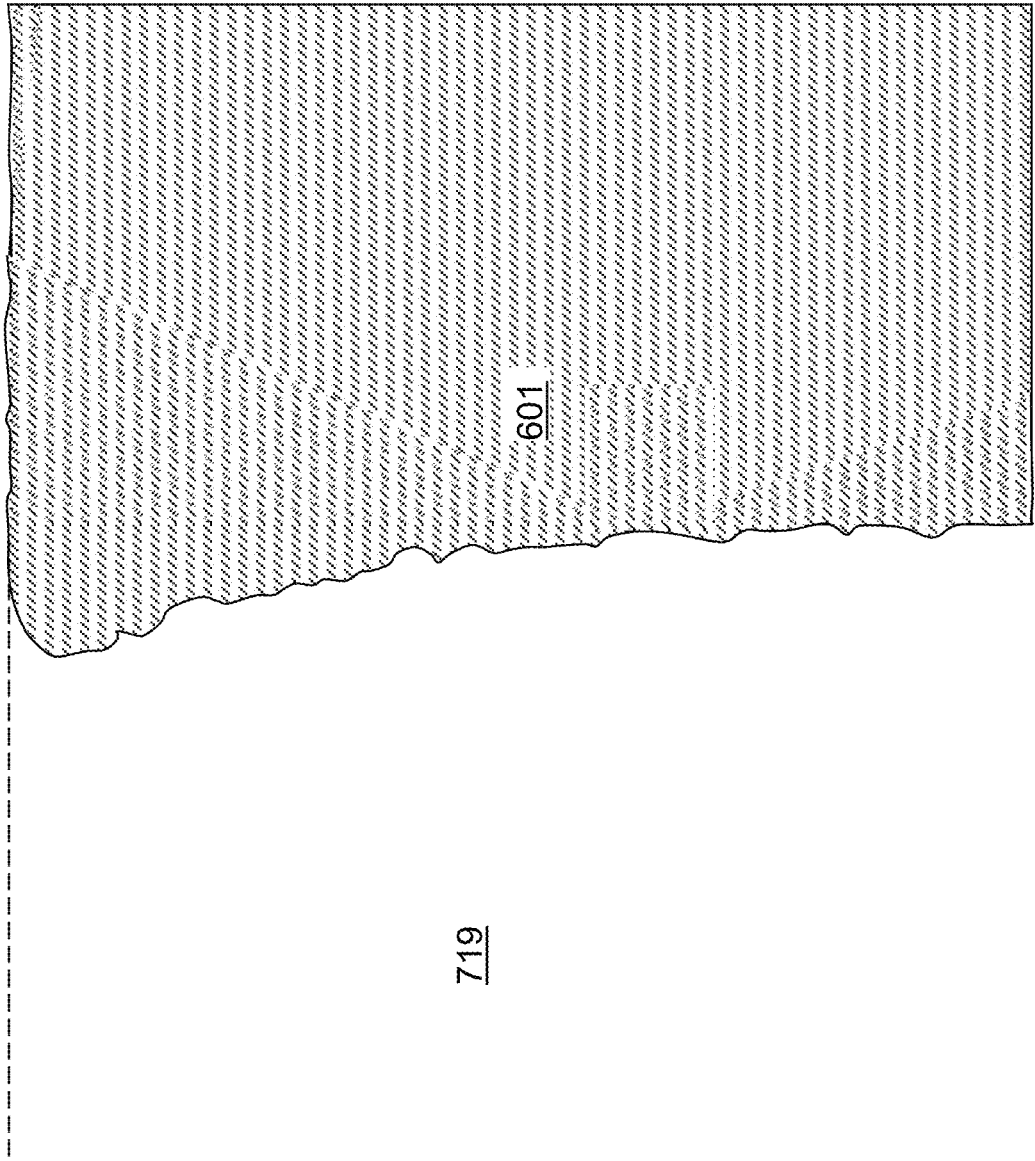

EPITAXIAL SEMICONDUCTOR LINER FOR ENHANCING UNIFORMITY OF A CHARGED LAYER IN A DEEP TRENCH AND METHODS OF FORMING THE SAME

BACKGROUND

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications such as digital cameras or embedded cameras in mobile devices. These devices utilize an array of pixels (which may include photodiodes and transistors) to detect radiation using photogeneration of electron-hole pairs. A backside illuminated (BSI) image sensor is an image sensor that is configured to detect light impinging on a backside of a semiconductor substrate. CMOS circuitry for detecting and processing photogenerated signals may be formed on a front side of the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a vertical cross-sectional view of the exemplary structure after removal of a hard mask layer and a pad dielectric layer according to an embodiment of the present disclosure.

FIG. 6B is a magnified view of region B in FIG. 6A.

DETAILED DESCRIPTION

Figures 1A, 1B:
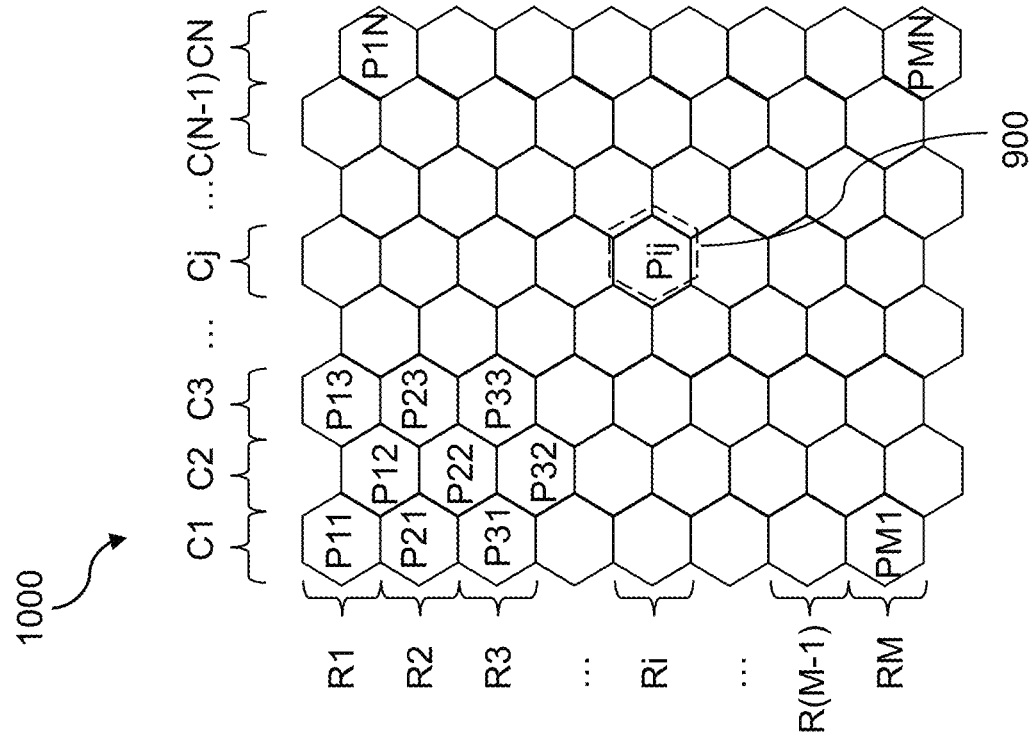
FIG. 1A is a plan view of a first configuration for an array of pixels of an image sensor according to an embodiment of the present disclosure.
FIG. 1B is a plan view of a second configuration for an array of pixels of an image sensor according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a backside illuminated complementary metal-oxide-semiconductor (CMOS) image sensor and methods of forming the same.

Generally, the structures and methods of the present disclosure may be used to provide an image sensor having low dark current and reduce formation of white pixels in an image sensor. An epitaxy process may be performed after formation of deep trenches to form a single crystalline semiconductor liner that is epitaxially aligned to the single crystalline material of the semiconductor substrate. A dielectric metal oxide liner may be used in deep trenches that surround each semiconductor material portion that extends between a front surface and a backside surface of a semiconductor substrate. The dielectric metal oxide liner may trap negative electrical charges to provide depletion regions around the deep trenches. The single crystalline semiconductor liner may cure the defects on the sidewalls of the deep trenches to provide a semiconductor surface having a lesser root-mean-square surface roughness and having a lower density of surface defects. The dielectric metal oxide liner may be formed with a lesser defect density and a lesser thickness, which may be advantageously used to provide a more uniform negatively charged film that is more effective in providing a surface depletion zone and in suppressing dark current and preventing formation of white pixels.

Specifically, photodetectors, transistors, and metal interconnect structures may be formed on a front side of a semiconductor substrate. Deep trenches may be formed from the backside of the semiconductor substrate toward the front side using an anisotropic etch process. The anisotropic etch process forms deep trenches having a depth in a range from 1.5 microns to 10 microns. Significant surface damage may occur on the sidewalls of the deep trenches. Formation of a dielectric metal oxide liner on such damaged sidewalls typically results in significant variations in the local thickness of the dielectric metal oxide liner. Further, a predominant portion of sidewalls of the deep trenches as formed by an anisotropic etch process include non-facet surfaces, i.e., surfaces that are not located in crystallographic planes. Such surfaces increase the average thickness of a dielectric metal oxide liner that may be formed thereupon. A thick dielectric metal oxide liner is less effective as a charge-containing layer that may provide negative surface charges. Further, local variations in the thickness of the dielectric metal oxide liner causes non-uniform distribution of negative charges, and makes device characteristic unpredictable for the photodetectors.

An epitaxial semiconductor deposition process is used to form a single crystalline semiconductor liner, which covers the non-facet surfaces of the sidewalls of the deep trenches, and provides surfaces made predominantly of facet surfaces. Further, the surface defects on the sidewalls of the deep trenches may be partly or fully cured by the single crystalline semiconductor liner. In addition, the physically exposed surfaces of the single crystalline semiconductor liner have less surface roughness than the sidewalls of the deep trenches as formed by the anisotropic etch process. A dielectric metal oxide liner formed on the physically exposed surfaces of the single crystalline semiconductor liner may have a lesser thickness and a lesser thickness variation than a dielectric metal oxide liner formed directly on damaged sidewalls of a deep trench. The dielectric metal oxide liner may be formed with a non-stoichiometric composition having excess oxygen atoms, which provide negative charges. By forming the single crystalline semiconductor liner prior to formation of the dielectric metal oxide liner, the dielectric metal oxide liner may be formed with a lesser average thickness and with a lesser thickness variation, and thus, may function more effectively to provide a more uniform and thicker depletion region around the deep trenches. The dielectric metal oxide liner functions as a uniform negatively charged film, which may be advantageously used to reduce dark current and white pixels for an image sensor.

Referring to FIGS. 1A and 1B, a first configuration for an array 1000 of pixels 900 of an image sensor and a second configuration of an array 1000 of pixels 900 of an image sensor are illustrated in a plan view, respectively. The image sensor may be a backside illuminated (BSI) image sensor device. However, it should be appreciated that embodiments of the disclosure may be used in a front side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to $2^{16}$, such as from $2^8$ to $2^{14}$. The rows of pixels 900 may be consecutively numbered with integers that range from 1 to M, and the columns of pixels 900 may be consecutively numbered with integers that range from 1 to N. A pixel Pij refers to a pixel 900 in the i-th row and in the j-th column.

Each pixel 900 includes at least one photodetector that may be configured to detect radiation of a given wavelength range. Each pixel 900 may include a plurality of photodetectors configured to detect radiation of a respective wavelength range, which may be different among the plurality of photodetectors. In one embodiment, each pixel 900 may include a plurality of subpixels, each of which including a respective combination of a photodetector and an electronic circuit configured to detect radiation that impinged into the photodetector. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information in impinging radiation for a unit detection area. A subpixel generates information on the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photodetectors in a pixel array region may include photodiodes, complimentary metal-oxide-semiconductor (CMOS) image sensors, charged coupling device (CCD) sensors, active sensors, passive sensors, other applicable sensors, or a combination thereof.

Figure 2A:
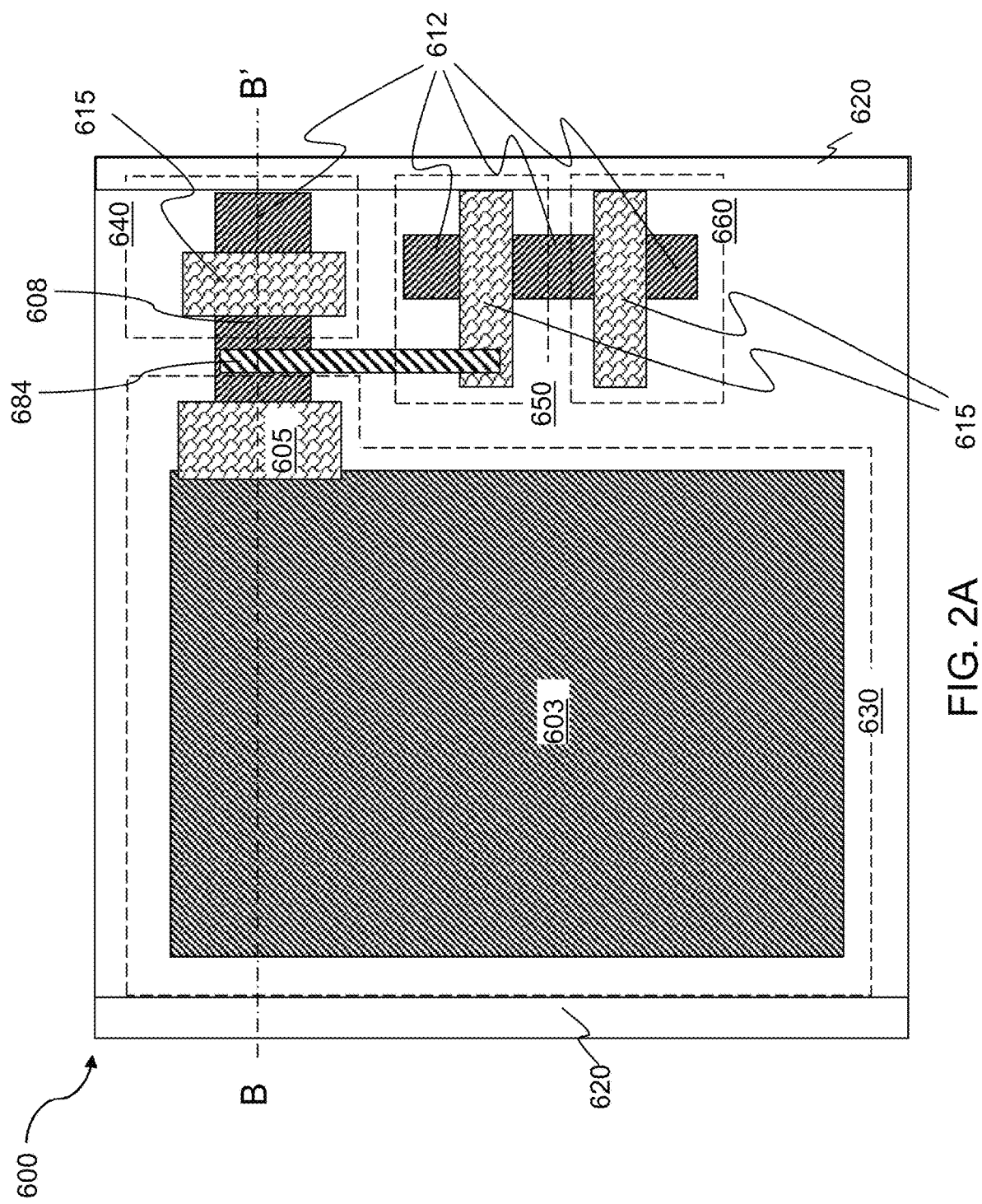
FIG. 2A is a plan view of front side sensor components within the area of a subpixel in an exemplary structure according to an embodiment of the present disclosure.
Figure 2B:
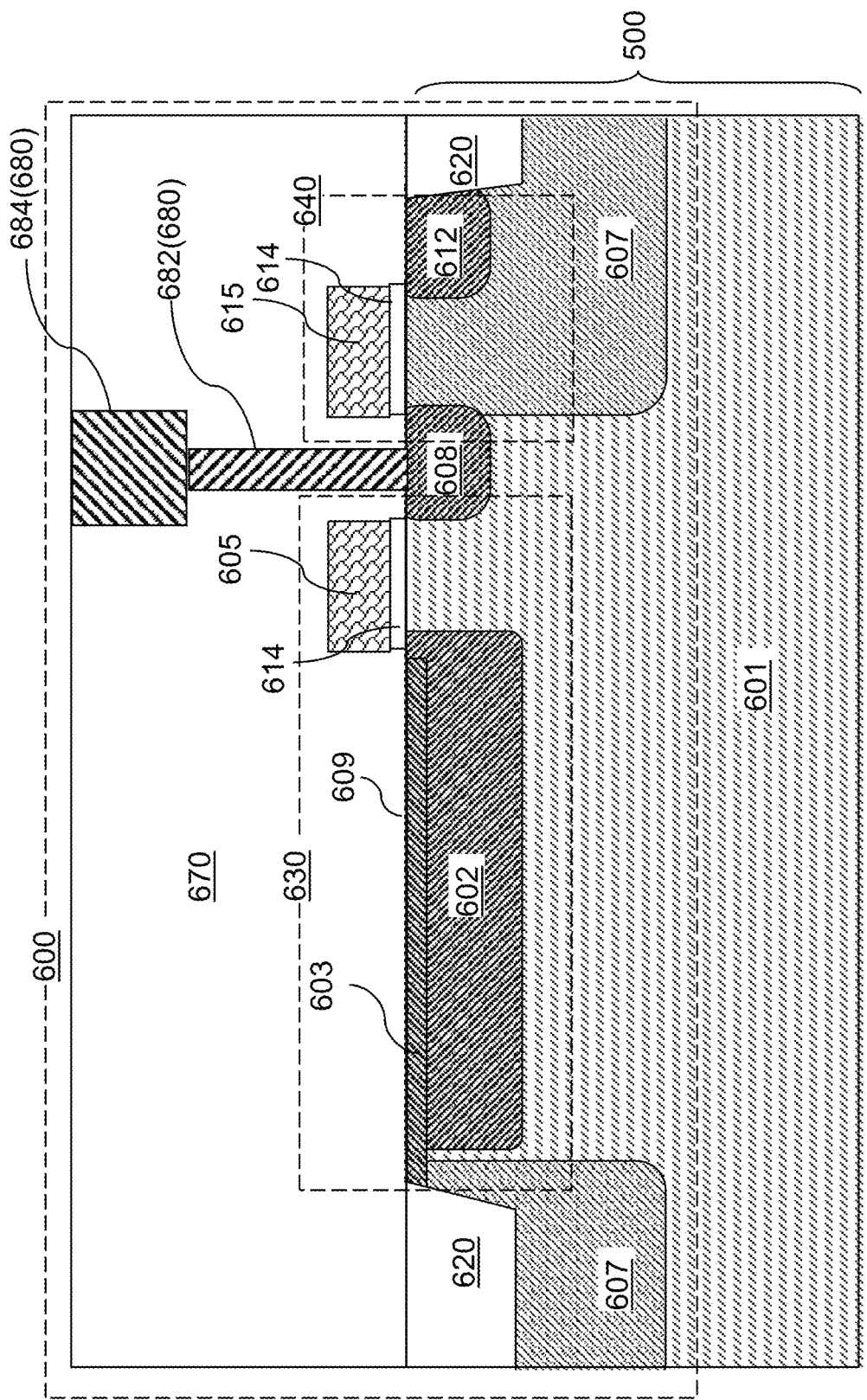
FIG. 2B is a vertical cross-sectional view of the exemplary structure along the vertical plane B-B' of FIG. 2A.

Referring to FIGS. 2A and 2B, front side sensor components 600 within the areas of a subpixel in an image sensor are illustrated. Interconnect-level dielectric layers 670 are omitted in FIG. 2A for clarity. A semiconductor substrate 500 includes a substrate semiconductor layer 601. Front side sensor components 600 include all components of the image sensor that may be formed on the front surface 609 of the semiconductor substrate 500, or may be formed within the substrate semiconductor layer 601. Each subpixel includes a photodetector and a sensing circuit for the photodetector. A set of subpixels may be used for a pixel, and an array 1000 of pixels may be arranged as illustrated in FIG. 1A or in FIG. 1B, or in any other suitable array configurations to provide an image sensor.

Each subpixel may be formed on, or in, the substrate semiconductor layer 601, which has a front surface 609 and a back surface. The substrate semiconductor layer 601 includes a semiconductor material such as silicon, germanium, a silicon-germanium alloy, a compound semiconductor material, or any other semiconductor material having a band gap that that does not exceed the energy of the photons to be detected. The material within the substrate semiconductor layer 601 may be selected based on the energy range of the photons to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step may have a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitable doped to have a first conductivity type, which may be p-type or n-type. For example, an epitaxial semiconductor deposition process may be performed to form a single crystalline epitaxial semiconductor material layer at an upper portion of the substrate semiconductor layer such that the atomic concentration of the dopants of the first conductivity type is in a range from $1.0 \times 10^{13}/cm^3$ to $1.0 \times 10^{16}/cm^3$, although lesser and greater atomic concentrations may also be used. The thickness of the single crystalline epitaxial semiconductor material layer may be in a range from 1 micron to 10 microns.

First-conductivity-type wells 607 may be formed by ion implantation around regions in which shallow trench isolation structures 620 are to be subsequently formed. The atomic concentration of dopants of the first conductivity type in the first-conductivity-type wells 607 may be in a range from $1.0 \times 10^{15}/cm^3$ to $1.0 \times 10^{18}/cm^3$, although lesser and greater atomic concentrations may also be used. Shallow trench isolation structures 620 may be formed to provide electrical isolation between the various components within the subpixel.

Gate structures (614, 605, 615) may be formed over the front surface 609 of the semiconductor substrate 500 by depositing and patterning a layer stack including a gate dielectric layer and a gate electrode layer. Each patterned portion of the layer stack constitutes a gate structure (614, 605, 615), which include a transfer gate structure (614, 605) and control gate structures (614, 615). The transfer gate structure (614, 605) is the gate structure for a transfer transistor 630, and includes a stack of a gate dielectric 614 and a transfer gate electrode 605. Each of the control gate structures (614, 615) includes a respective layer stack of a gate dielectric 614 and a gate electrode 615 of other transistors in a sensing circuit, which may include a reset transistor 640, a source-follower transistor 650, a select transistor 660, and other suitable transistors that may be used to amplify the signal generated by the photodetector of the subpixel.

Dopants of a second conductivity type may be implanted through the front surface 609 of the semiconductor substrate 500 using at least one masked ion implantation process. The second conductivity type is the opposite of the first conductivity type. For example, if the first conductivity type is p-type, the second conductivity type is n-type, and vice versa. Various doped regions having a doping of the second conductivity type may be formed by the at least one masked ion implantation process. A second-conductivity-type pinned photodiode layer 602 may be formed underneath the front surface 609 of the semiconductor substrate 500 such that a periphery of the second-conductivity-type pinned photodiode layer 602 overlaps with an edge of the transfer gate electrode 605 in a plan view. Various active regions (608, 612) having a doping of the second conductivity type may be formed, which include a floating diffusion region 608 that functions as the drain region of the transfer transistor 630. The second-conductivity-type pinned photodiode layer 602 accumulates electrical charges (such as electrons in case the second conductivity type is n-type) during sensing (i.e., while the subpixel actively detects the photons impinging thereupon, for example, for the purpose of taking a frame or a photo) functions as the source region of the transfer transistor 630. The active regions 612 include source regions and drain regions of the various transistors (640, 650, 660) in the sensing circuit.

A first-conductivity-type pinning layer 603 may be formed directly on top of the second-conductivity-type pinned photodiode layer 602 by ion implantation of dopants of the first conductivity type. The first-conductivity-type pinning layer 603 may suppress depletion of the interface between the second-conductivity-type pinned photodiode layer 602 and the first-conductivity-type pinning layer 603, and electrically stabilizes the second-conductivity-type pinned photodiode layer 602.

Interconnect-level dielectric layers 670 may be formed over the front surface 609 of the semiconductor substrate 500, and metal interconnect structures 680 connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 and various meal line structures 684. For example, the floating diffusion region 608 may be connected to the gate electrode 615 of the source-follower transistor 650 by a subset of the metal interconnect structures 680. A photodetector may be embodied as a transfer transistor 630, and may be connected to a sense circuit including additional transistors (640, 650, 660).

Figure 3:
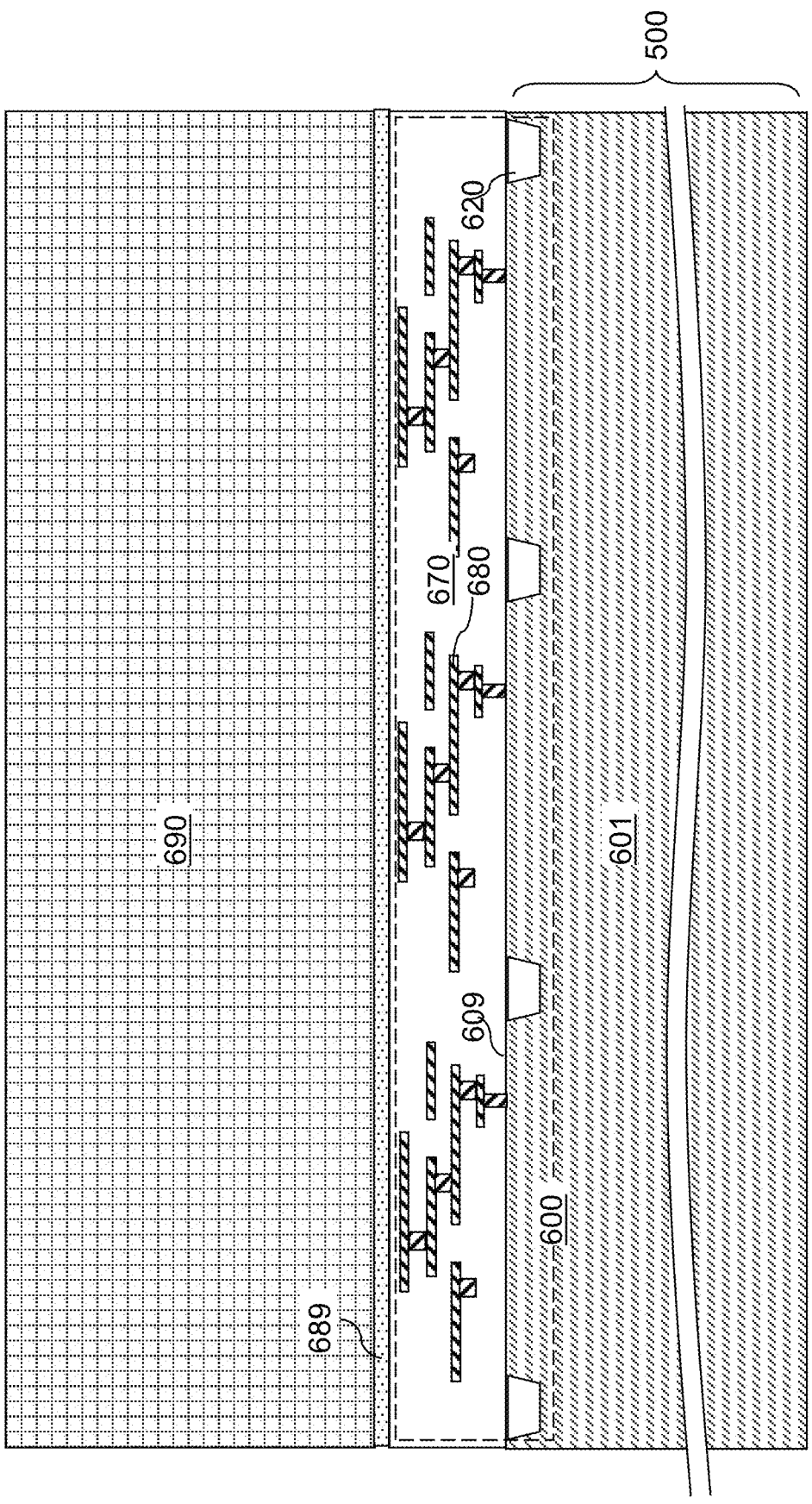
FIG. 3 is a vertical cross-sectional view of the exemplary structure after formation of metal interconnect structures formed in interconnection-level dielectric layers and attachment of a carrier substrate according to an embodiment of the present disclosure.

Referring to FIG. 3, additional interconnect-level dielectric layers 670 and additional metal interconnect structures 680 may be formed on the front side of the semiconductor substrate 500. The front side of the assembly of the semiconductor substrate 500, the interconnect-level dielectric layers 670, and the structures formed therein may be bonded to a carrier substrate 690. The carrier substrate 690 may be temporarily attached to the assembly of the semiconductor substrate 500 and the interconnect-level dielectric layers 670 to provide subsequent thinning of the semiconductor substrate 500, and to provide subsequent handling of the assembly of a thinned semiconductor substrate 500 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Generally, an array of front side sensor components 600 may be formed on the semiconductor substrate 500. The front side sensor components 600 include front-side components of the array 1000 of pixels illustrated in FIGS. 1A and 1B. Each subpixel area of the front-side components 600 can comprise a respective photodetector including a transfer transistor and a respective sensing circuit located on a front surface of the semiconductor substrate 500. Each sensing circuit includes transistors. Interconnect-level dielectric layers 670 and metal interconnect structures 680 may be formed on the front side of the semiconductor substrate 500.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Other suitable means of bonding are within the contemplated scope of disclosure. Optionally, a bonding buffer layer 689 including an intermediate bonding material (e.g., silicon oxide, silicon nitride, or a semiconductor material) may be used to provide bonding between the interconnection-level dielectric layers 670 and the carrier substrate 690. The carrier substrate 690 may be directly attached to the interconnect-level dielectric layers 670, or may be attached to the interconnect-level dielectric layers 670 through a bonding buffer layer 689.

Figure 4:
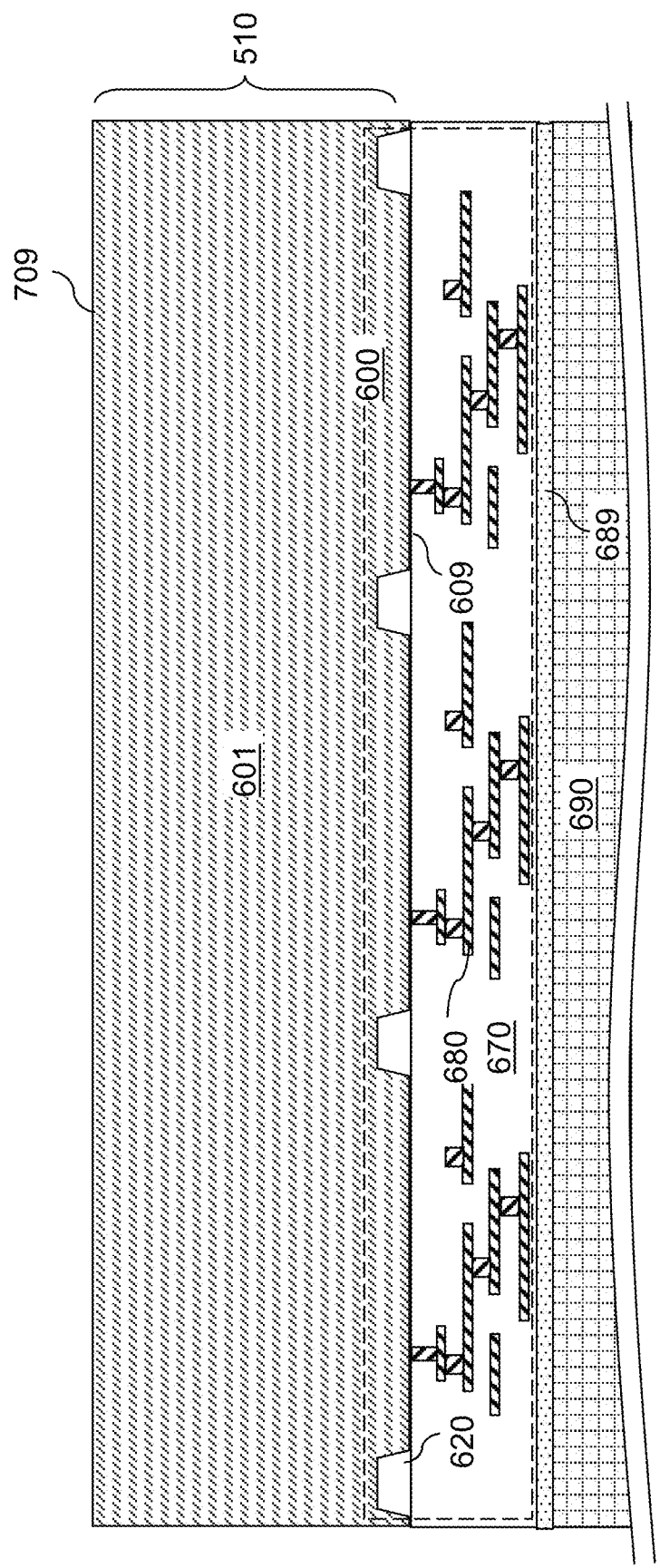
FIG. 4 is a vertical cross-sectional view of the exemplary structure after thinning a semiconductor substrate according to an embodiment of the present disclosure.

Referring to FIG. 4, the backside of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. In one embodiment, the semiconductor substrate 500 may be thinned to a thickness in a range from 1 micron to 12 microns, such as from 1.5 microns to 8 microns. The semiconductor substrate 500 as thinned after the thinning process is herein referred to as a thinned semiconductor substrate 510, or as a semiconductor substrate 500. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches to be subsequently formed on the backside of the semiconductor substrate 510 reaches proximal surfaces of the shallow trench isolation structures 620. The backside surface 709 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 5:
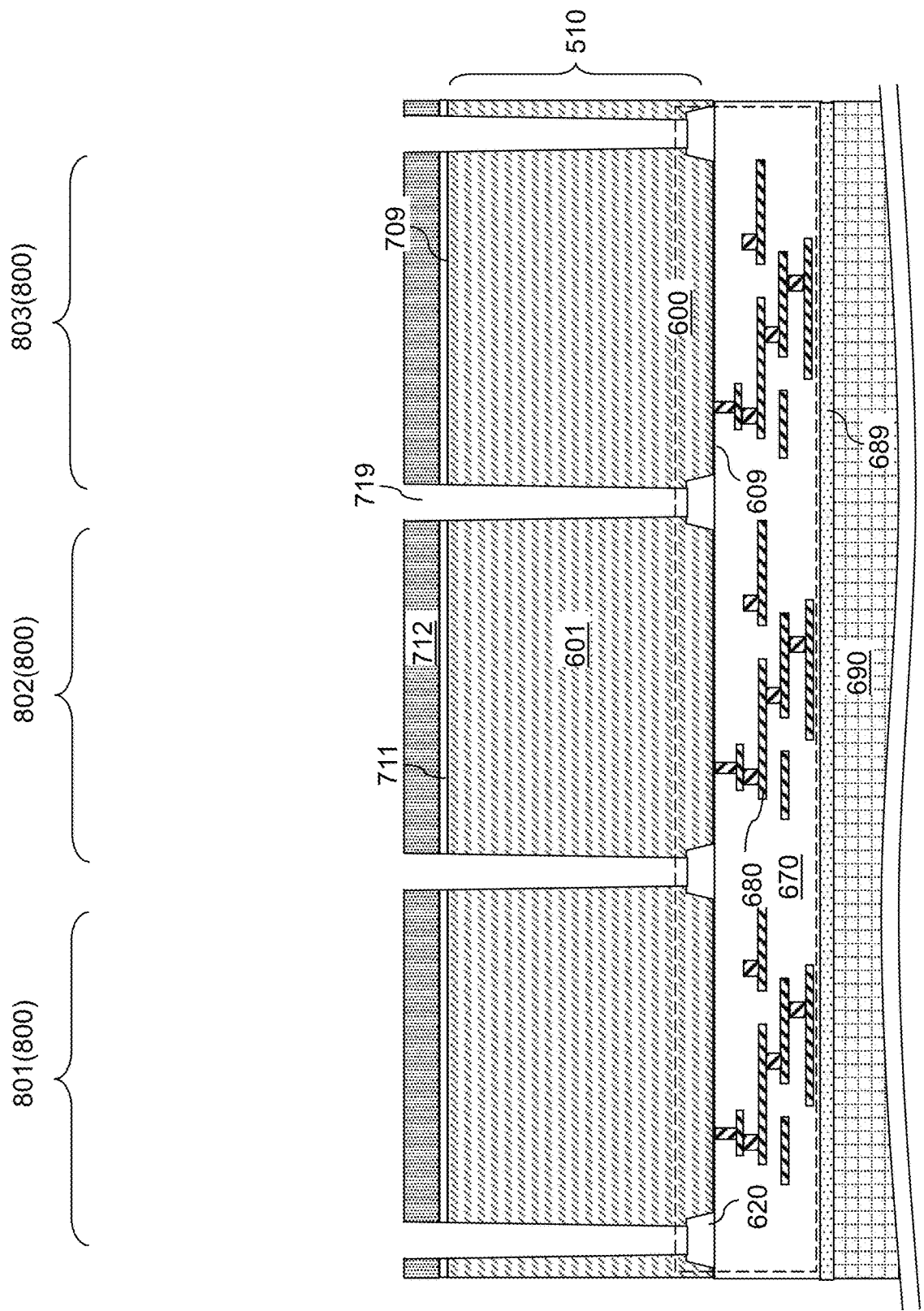
FIG. 5 is a vertical cross-sectional view of the exemplary structure after formation of deep trenches on the backside of the semiconductor substrate according to an embodiment of the present disclosure.

Referring to FIG. 5, an optional pad dielectric layer 711 and a hard mask layer 712 may be formed over the backside surface 709 of the semiconductor substrate 510. The optional pad dielectric layer 711, if present, may include a silicon oxide layer, and may have a thickness in a range from 5 nm to 50 nm. The hard mask layer 712 includes an etch mask material that may be subsequently removed selective to the pad dielectric layer 711 and/or selective to the semiconductor substrate 510. For example, the hard mask layer 712 may include silicon nitride, borosilicate glass, or a metallic material. The hard mask layer 712 may have a thickness in a range from 50 nm to 800 nm, although lesser and greater thicknesses may also be used.

A photoresist layer (not shown) may be applied over the hard mask layer 712, and may be lithographically patterned to form openings that generally replicate the pattern of the shallow trench isolation structures 620 located underneath. A first etch process may be performed to transfer the pattern in the photoresist layer through the hard mask layer 712 and the optional pad dielectric layer 711. Unmasked portions of the semiconductor substrate 510 may be etched by performing a second anisotropic etch process, which transfers the pattern of the openings in the photoresist layer and the hard mask layer 712 through the semiconductor substrate 510 to a top surface of a respective one of the shallow trench isolation structures 620. The depth of the deep trenches 719 may be in a range from 1 micron to 10 microns, such as from 1.5 microns to 8 microns. The photoresist layer may be completely consumed during the second anisotropic etch process. Deep trenches 719 may be formed through the semiconductor substrate 510.

Generally, the substrate semiconductor layer 601 may have a first planar surface (such as the front surface 609) and a second planar surface (such as the backside surface 709) that is parallel to the first planar surface. The deep trenches 719 may be contained within the substrate semiconductor layer 601. The deep trenches 719 may be formed through the second planar surface (such as the backside surface 709) and extends from the second planar surface toward the first planar surface, i.e., toward the front side of the semiconductor substrate 510. In one embodiment, the shallow trench isolation structures 620 may be located in the semiconductor substrate 510 on the front side 609 of the semiconductor substrate 510 between the transistors. Each of the deep trenches 719 may vertically extend through the semiconductor substrate 510 to a respective one of the shallow trench isolation structures 620. A horizontal surface of a shallow trench isolation structure 620 may be physically exposed at the bottom of each deep trench 719. In one embodiment, all bottom surfaces of the deep trenches 719 may be surfaces of the shallow trench isolation structures 620.

The deep trenches 719 may define areas for subpixels 800. Each subpixel 800 may be located within a respective subpixel region, which is located within a region of a pixel, i.e., within a pixel region. For example, an area of a pixel may include an area of a first subpixel 801, an area of a second subpixel 802, and an area of a third subpixel 803. In an illustrative example, the first subpixel 801 may be formed in a region that includes a photodetector configured to detect green light, the second subpixel 802 may be formed in a region that includes a photodetector configured to detect red light, and the third subpixel 803 may be formed in a region that includes a photodetector configured to detect blue light. Each subpixel 800 may include a volume containing a patterned columnar portion of the semiconductor substrate 510 that is laterally enclosed by a contiguously connected set of deep trenches 719. A pixel region of a pixel includes all subpixel regions for the set of subpixels 800 contained within the pixel.

Referring to FIGS. 6A and 6B, the hard mask layer 712 may be removed selective to the semiconductor substrate 510, the pad dielectric layer 711, and the shallow trench isolation structures 620. In an illustrative example, if the hard mask layer 712 includes silicon nitride, a wet etch process using hot phosphoric acid may be performed to remove the hard mask layer 712. Subsequently, the pad dielectric layer 711 may be removed selective to the semiconductor substrate 510.

A plurality of deep trenches 719 may vertically extend from the backside surface 709 of the semiconductor substrate 510 toward the front surface at boundaries between neighboring pairs of the subpixels. Each deep trench 719 may have a depth in a range from 1.5 microns to 10 microns, although lesser and greater depths may also be used. Each deep trench 719 may have a sidewall that includes a vertical or tapered surface.

In one embodiment, a deep trench 719 may have a bowed vertical cross-sectional profile, i.e., a profile having a greater width at a middle portion than at a top portion and than at a bottom portion. The taper angle within the deep trenches may be in a range from −10 degrees to +10 degrees. In one embodiment, a sidewall of a deep trench 719 may have a retro-tapered portion providing a trench width that increases with an increase in a vertical distance from the backside surface 709 of the semiconductor substrate 510, and a normal-tapered portion providing a trench width that decreases with an increase in the vertical distance from the backside surface 709 of the semiconductor substrate 510.

In one embodiment, the substrate semiconductor layer 601 may include a first single crystalline semiconductor material. The anisotropic etch process that etches through the semiconductor material of the substrate semiconductor layer 601 may generate significant surface damage on the sidewalls of the deep trenches 719. The sidewalls of the deep trenches may be physically exposed surfaces of the first single crystalline semiconductor material and include structural damages and surface variations caused by ion damages during the anisotropic etch process that forms the deep trenches 719. The surface damages may include recesses, protrusions, mini-pockets including a needle-shaped downward recess toward the front surface 609, locally amorphized or disoriented regions, or various other types of surface damages. The root-mean-square roughness of sidewalls of the deep trenches 719 is greater than 0.5 nm, and is typically in a range from 1 nm to 5 nm. The root-mean-square roughness of the physically exposed sidewalls of the substrate semiconductor layer 601 around each deep trench 719 is herein referred to as a first root-mean-square surface roughness. In other words, the first single crystalline semiconductor material of the substrate semiconductor layer 601 may have vertical or tapered surfaces with a first root-mean-square surface roughness greater than 0.5 nm at a sidewall of the trench.

Figure 7:
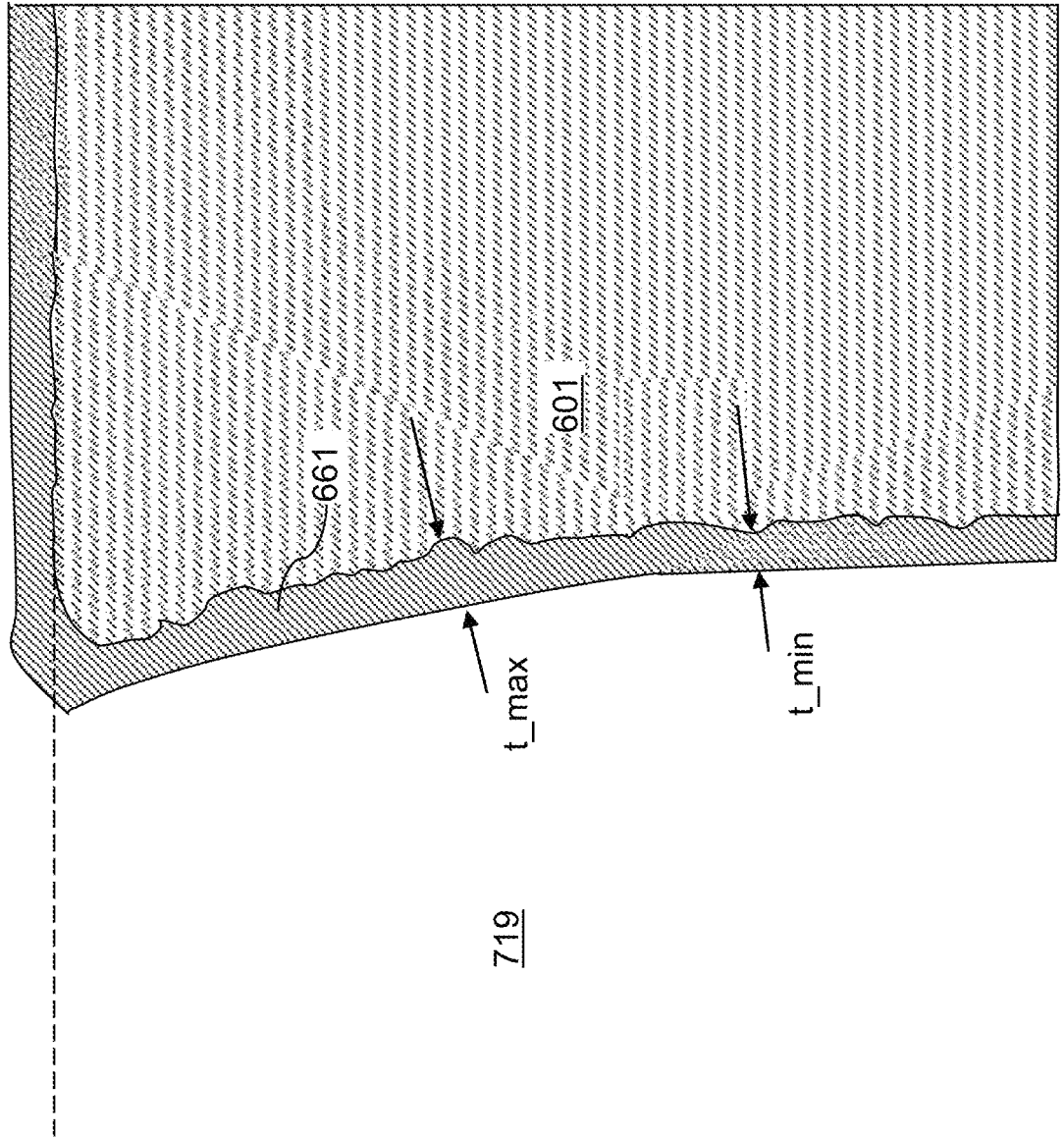
FIG. 7 is a magnified view of a portion of a deep trench after formation of a single crystalline semiconductor liner according to an embodiment of the present disclosure.

Referring to FIG. 7, the physically exposed surfaces of the substrate semiconductor layer 601 at peripheries of the deep trenches 719 and on the backside surface 709 of the semiconductor substrate 510 may be cleaned to remove a surface oxide, such as a native oxide including a non-stoichiometric composition of silicon oxide. For example, a wet etch process using dilute hydrofluoric acid or a HF vapor clean process using vapor phase hydrofluoric acid may be used to remove the surface oxide from the physically exposed surfaces of the first single crystalline semiconductor material of the substrate semiconductor layer 601.

A single crystalline semiconductor liner 661 including a second single crystalline semiconductor material may be formed by performing an epitaxial growth process on the physically exposed surfaces of the first single crystalline semiconductor material of the substrate semiconductor layer 601, which include the vertical or tapered surfaces of the deep trenches 719. Due to the presence of the metal interconnect structures 680 on the front side of the semiconductor substrate 510, the process temperature for the epitaxial growth process is limited to temperatures lower than 500 degrees Celsius. Thus, the growth temperature of the epitaxial growth process is limited to a temperature range below 500 degrees Celsius. The growth temperature of the epitaxial growth process of embodiments of the present disclosure may be in a range from 400 degrees Celsius to 500 degrees Celsius, and may be in a range from 420 degrees Celsius to 480 degrees Celsius.

The semiconductor precursor gas that may be used for the epitaxial growth process may be a silane-based semiconductor precursor gas such as silane or disilane. A carrier gas such as hydrogen, nitrogen, or argon may be used during the epitaxial growth process. The partial pressure of the silane-based semiconductor precursor gas during the epitaxial growth process may be in a range from 200 mTorr to 10 Torr. The total pressure within the process chamber that performs the epitaxial growth process may be in a range from 5 Torr to 300 Torr.

Typically, the deposition rate for a silane-based silicon deposition process decreases by 50% or more for every reduction in the deposition temperature of about 25 degrees Celsius. As such, an epitaxial growth process at a deposition temperature lower than 500 degrees Celsius provides a low deposition rate such as a deposition rate less than 100 nm per hour, which is impractical for deposition of a thick semiconductor film. According to an embodiment, the thickness of the single crystalline semiconductor liner 661 may be less than 20 nm, such as from 1.5 nm to 10 nm so that deposition of the single crystalline semiconductor liner 661 may be accomplished within reasonable processing time (such as less than 3 hours and/or less than 1 hour) for a semiconductor deposition tool. A silane-based silicon deposition process has been successfully tested to have a growth rate of about 10 nm per hour at 450 degrees Celsius.

The second single crystalline semiconductor material may be epitaxially aligned to the first single crystalline semiconductor material. In one embodiment, the single crystalline semiconductor liner 661 contains a vertically-extending portion that has a first side surface that contacts the vertical or tapered surface of the first single crystalline semiconductor material of the substrate semiconductor layer 601 on a first side. As discussed above, each vertical or tapered surface of first single crystalline semiconductor material of the substrate semiconductor layer 601 around the deep trenches 719 has a first root-mean-square surface roughness greater than 0.5 nm, which is typically in a range from 1 nm to 5 nm. The vertically-extending portion of the single crystalline semiconductor liner 661 has a second side surface (which is a physically exposed surface) with a root-mean-square surface roughness less than 0.5 nm, which is herein referred to as a second root-mean-square surface roughness. In one embodiment, the single crystalline semiconductor liner 661 has an average thickness in a range from 1.5 nm to 10 nm, and the first root-mean-square surface roughness is at least three times the second root-mean-square surface roughness. In other words, the second root-mean-square surface roughness may be less than one third of the first root-mean-square surface roughness.

The single crystalline semiconductor liner 661 generally forms faceted surfaces when formation of such faceted surfaces is energetically favorable over irregular surfaces. Generally, irregular surfaces with defects or a large surface height variation is energetically less favorable than faceted crystallographic surfaces, i.e., surfaces located within crystallographic planes having a respective Miller index. In one embodiment, more than 50% of an entire surface area of the vertical or tapered surface of each deep trench 719 comprises surface segments that do not contain faceted surfaces of the first single crystalline semiconductor material. In this case, the single crystalline semiconductor liner 661 may form a sufficient number of crystallographic planes as a growth plane such that more than 50% of an entire surface area of the second side surface of the second single crystalline semiconductor material of the single crystalline semiconductor liner 661 comprises surface segments that are faceted surfaces (i.e., crystallographic surfaces having a respective Miller index and contained within a Euclidean two-dimensional plane at a resolution of atomic thicknesses) of the second single crystalline semiconductor material.

In one embodiment, the width of the depletion region to be subsequently formed in the single crystalline semiconductor liner 661 and in adjacent portions of the substrate semiconductor layer 601 may be advantageously increased by adjusting the dopant concentration in the single crystalline semiconductor liner 661. In one embodiment, the first single crystalline semiconductor material of the substrate semiconductor layer 601 and the second single crystalline semiconductor material of the single crystalline semiconductor liner 661 have p-type doping, and the second single crystalline semiconductor material has a lower atomic concentration of p-type dopants than a portion of the first single crystalline semiconductor material in contact with the second single crystalline semiconductor material. For example, the portion of the first single crystalline semiconductor material in contact with the second single crystalline semiconductor material may include p-type dopants at an atomic concentration in a range from $1.0 \times 10^{13}/cm^3$ to $1.0 \times 10^{15}/cm^3$, and the second single crystalline semiconductor material may include p-type dopants at an atomic concentration in a range from $1.0 \times 10^{12}/cm^3$ to $1.0 \times 10^{14}/cm^3$.

The surface roughness of the single crystalline semiconductor liner 661 may be less than the surface roughness of the sidewalls of the substrate semiconductor layer 601 around the deep trenches 719. As such, the lateral thickness of the single crystalline semiconductor liner 661 may have a range that is comparable with the surface height variation of the sidewalls of the sidewalls of the substrate semiconductor layer 601 around the deep trenches 719. The difference between the maximum thickness t_max and the minimum thickness t_min of the single crystalline semiconductor liner 661 may be in a range from 1.5 nm to 6 nm, and may be in a range from 40% to 100% of the average thickness of the single crystalline semiconductor liner 661.

Figure 8A:
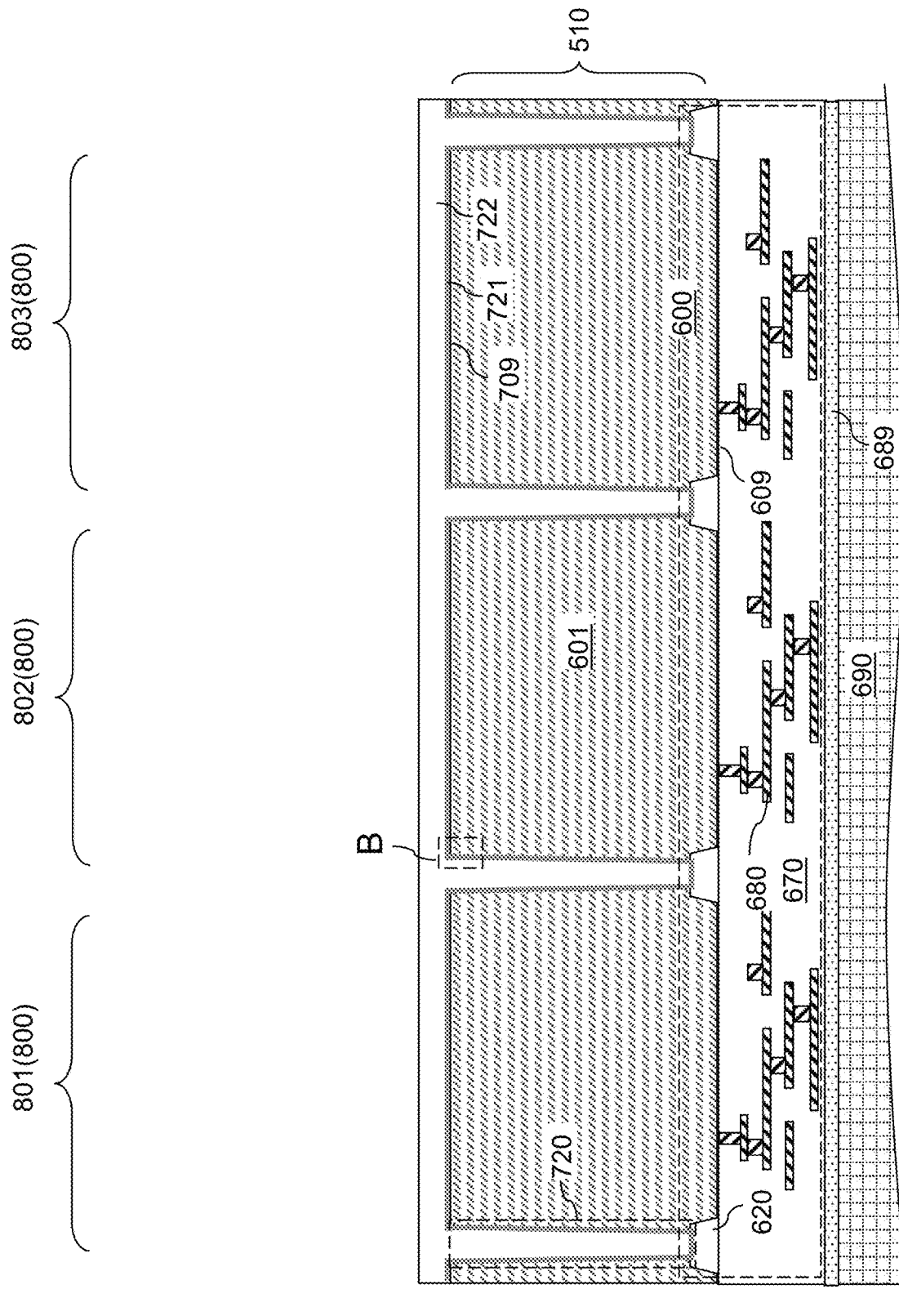
FIG. 8A is a vertical cross-sectional view of the exemplary structure after formation of at least one dielectric metal oxide liner and a dielectric isolation layer according to an embodiment of the present disclosure.
Figure 8B:
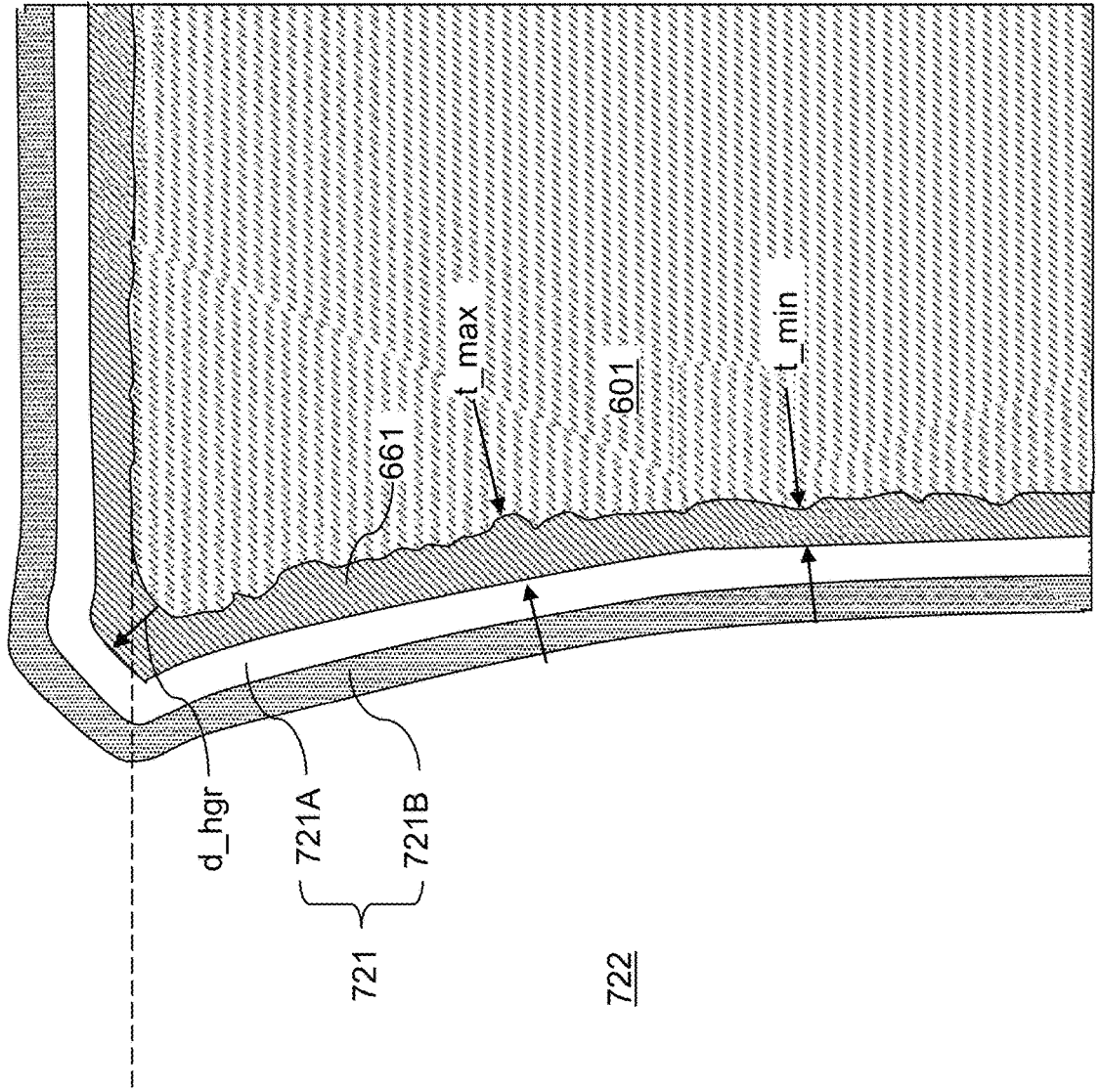
FIG. 8B is a magnified view of region B in FIG. 8A.

Referring to FIGS. 8A and 8B, at least one dielectric metal oxide liner 721 may be formed on the second side surface of the single crystalline semiconductor liner 661. In one embodiment, the at least one dielectric metal oxide liner 721 includes a dielectric metal oxide material that may trap negative charges therein. For example, at least one layer within the at least one dielectric metal oxide liner 721 includes a non-stoichiometric oxygen-rich dielectric metal oxide that traps negative electrical charges therein. The at least one dielectric metal oxide liner 721 may include a single layer of a negative-charge-trapping dielectric metal oxide material, or a plurality of layers of different negative-charge-trapping dielectric metal oxide materials. Generally, a uniform film composition and a uniform film thickness for each layer within the at least one dielectric metal oxide liner 721 facilitates uniform distribution of the negative electrical charges. However, surface defects or surface roughness causes uneven distribution of the negative electrical charges in the at least one dielectric metal oxide liner 721. Thus, the reduction in the surface roughness through use of the single crystalline semiconductor liner 661 facilitates uniformity of the at least one dielectric metal oxide liner 721 and uniformity of the negative electrical charges trapped in the at least one dielectric metal oxide liner 721.

In one embodiment, the at least one dielectric metal oxide liner 721 comprises a layer stack of a first dielectric metal oxide liner 721A and a second dielectric metal oxide liner 721B. The first dielectric metal oxide liner 721A may be deposited first, and is herein referred to as an outer dielectric metal oxide liner. The second dielectric metal oxide liner 721B may be deposited later on a sidewall of the first dielectric metal oxide liner 721A, and is herein referred to as an inner dielectric metal oxide liner.

In one embodiment, the first dielectric metal oxide liner 721A may include an aluminum oxide layer contacting the single crystalline semiconductor liner 661 and having a thickness in a range from 0.8 nm to 1.6 nm, and having a root-mean-square thickness variation less than 0.1 nm. Formation of an interfacial silicon oxide layer between the aluminum oxide layer and the single crystalline semiconductor liner 661 may be significantly reduced due to the reduced surface roughness of the single crystalline semiconductor liner 661 relative to the surface roughness of the sidewalls of the substrate semiconductor layer 601 around the deep trenches 719 as formed by the anisotropic etch process.

In one embodiment, the second dielectric metal oxide liner 721B (i.e., the dielectric metal oxide liner) includes a dielectric metal oxide material having a dielectric constant greater than 7.9, having a material composition different from aluminum oxide such as hafnium oxide. The second dielectric metal oxide liner 721B may contact the first dielectric metal oxide liner 721A (such as the aluminum oxide layer).

Generally, each layer within the at least one dielectric metal oxide liner 721 may include a dielectric metal oxide material having a dielectric constant greater than 7.9 (i.e., a "high-k" dielectric material). Exemplary dielectric metal oxide materials that may be used for the at least one dielectric metal oxide liner 721 include hafnium oxide, aluminum oxide, zirconium oxide, magnesium oxide, calcium oxide, yttrium oxide, tantalum oxide, strontium oxide, titanium oxide, lanthanum oxide, barium oxide or combinations thereof. Other suitable materials may be used within the contemplated scope of the disclosure. Each layer within the at least one dielectric metal oxide liner 721 may be deposited using a chemical vapor deposition process or an atomic layer deposition (ALD). The thickness of the at least one dielectric metal oxide liner 721 may be in a range from 4 nm to 12 nm, although lesser and greater thicknesses may also be used. In one embodiment, the at least one dielectric metal oxide liner 721 includes a first dielectric metal oxide liner 721A having a thickness in a range from 3 nm to 6 nm and a second dielectric metal oxide liner 721B having a thickness in a range from 3 nm to 6 nm.

The at least one dielectric metal oxide liner 721 may be formed to provide negative charge trapping. For example, the at least one dielectric metal oxide liner 721 may be deposited with a non-stoichiometric oxygen-rich composition, or may be surface-treated, for example, with plasma, to have a non-stoichiometric oxygen-rich surface compression. In this case, the at least one dielectric metal oxide liner 721 may include an oxygen-rich dielectric metal oxide material with negatively charged interstitial oxygen atoms and/or dangling or broken metal oxide bonds, thereby providing accumulation of negative charges within the at least one dielectric metal oxide liner 721. In an illustrative example, the areal density of accumulated negative charges within the at least one dielectric metal oxide liner 721 may be in a range from $5.0 \times 10^9$ electrons per $cm^2$ to $1.0 \times 10^{14}$ electrons per $cm^2$, such as from $1.0 \times 10^{10}$ electrons per $cm^2$ to $2.0 \times 10^{13}$ electrons per $cm^2$. The dielectric metal oxide material used in the at least one dielectric metal oxide liner 721 may accumulate more negative charges than other dielectric materials such as silicon nitride or silicon oxide. The negative charge in the at least one dielectric metal oxide liner 721 increases hole accumulation within interfacial portions of the first-conductivity-type wells 607 and the substrate semiconductor layer 601 of the semiconductor substrate 510. A depletion region may be formed within portions of the first-conductivity-type wells 607 and the substrate semiconductor layer 601 of the semiconductor substrate 510 that are proximal to the at least one dielectric metal oxide liner 721. The depletion region reduces dark current and/or white pixels for the image sensor.

In some embodiments, minimizing the average thickness of the first dielectric metal oxide liner 721A without increasing the surface roughness of the first dielectric metal oxide liner 721A may be advantageous for the purpose of providing a uniform negative charge in the at least one dielectric metal oxide liner 721. In this case, use of the single crystalline semiconductor liner 661 provides such reduction in the thickness of the first dielectric metal oxide liner 721A (such as an aluminum oxide layer).

In one embodiment, the substrate semiconductor layer 601 has a p-type doping, and each photodetector comprises an n-doped pinned photodiode layer as a second-conductivity-type pinned photodiode layers 602. The at least one dielectric metal oxide liner 721 may comprise, and/or may consist essentially of, at least one oxygen-rich dielectric metal oxide material and having a net negative charge. In one embodiment, the net negative charge may have an areal density from $5.0 \times 10^9$ electrons per cm$^2$ to $1.0 \times 10^{14}$ electrons per cm$^2$.

A dielectric isolation layer 722 may be formed by conformally depositing a dielectric material in remaining volumes of the deep trenches 719 on the at least one dielectric metal oxide liner 721. The dielectric isolation layer 722 includes a dielectric material such as silicon oxide. The silicon oxide may include undoped silicate glass, a doped silicate glass (such as borosilicate glass), or a combination thereof. The combination of the dielectric metal oxide liner 721 and the dielectric isolation layer 722 may fill the deep trenches 719 (with or without seams and/or encapsulated cavities). The vertically-extending portions of the combination of the dielectric metal oxide liner 721 and the dielectric isolation layer 722 that fill the deep trenches 719 are herein referred to as deep trench isolation structures 720. Horizontally-extending portions of the dielectric metal oxide liner 721 and the dielectric isolation layer 722 may overlie the backside surface of the semiconductor substrate 510. In case the dielectric isolation layer 722 includes silicon oxide, a silicon oxide material portion (i.e., a vertically-extending portion of the dielectric isolation layer 722) may be located inside each deep trench 719, and may contact a surface of the inner dielectric metal oxide liner (i.e., the second dielectric metal oxide liner 721B).

Figure 9A:
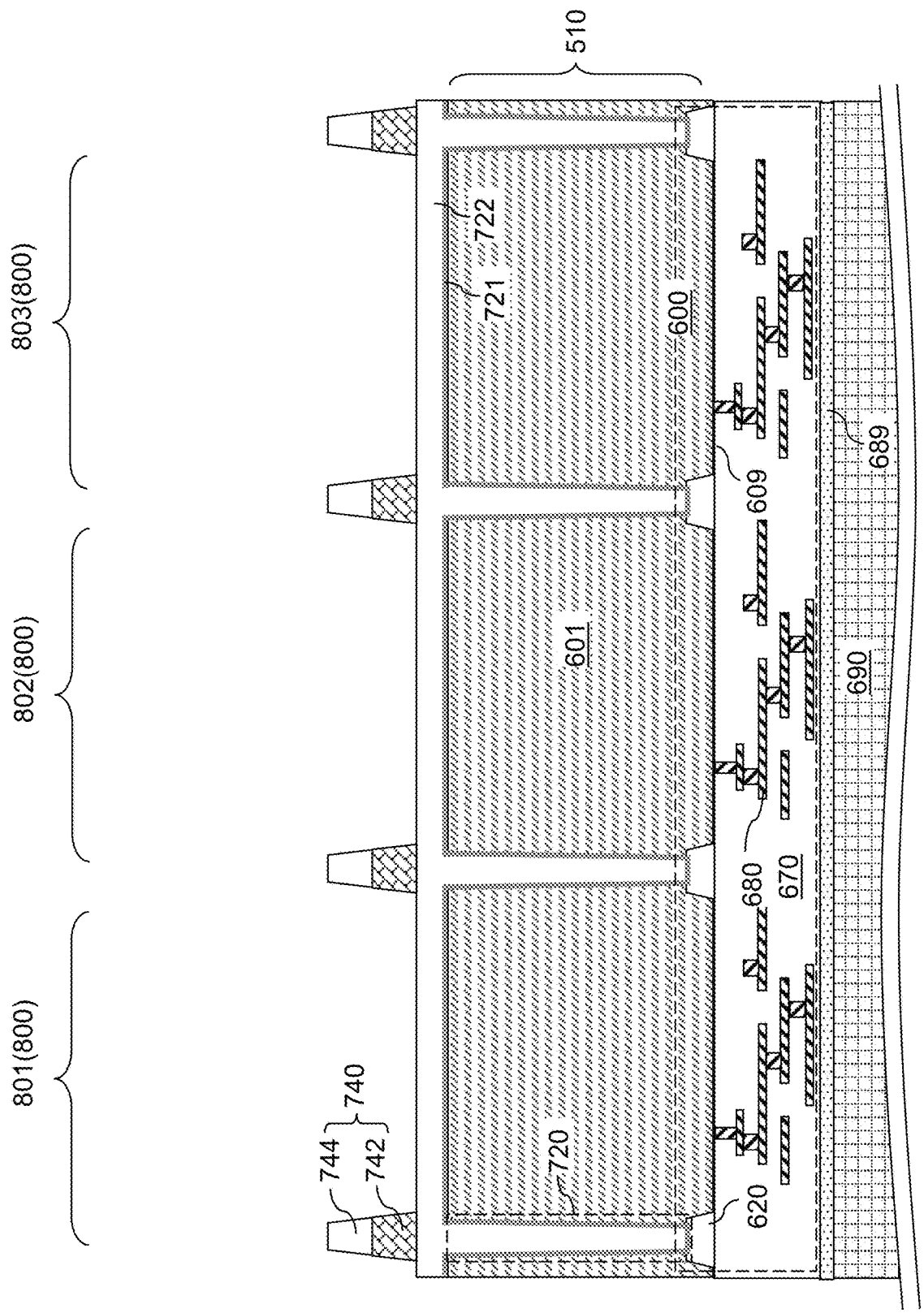
FIG. 9A is vertical cross-sectional views of the exemplary structure after formation of a grid structure according to an embodiment of the present disclosure.
Figure 9B:
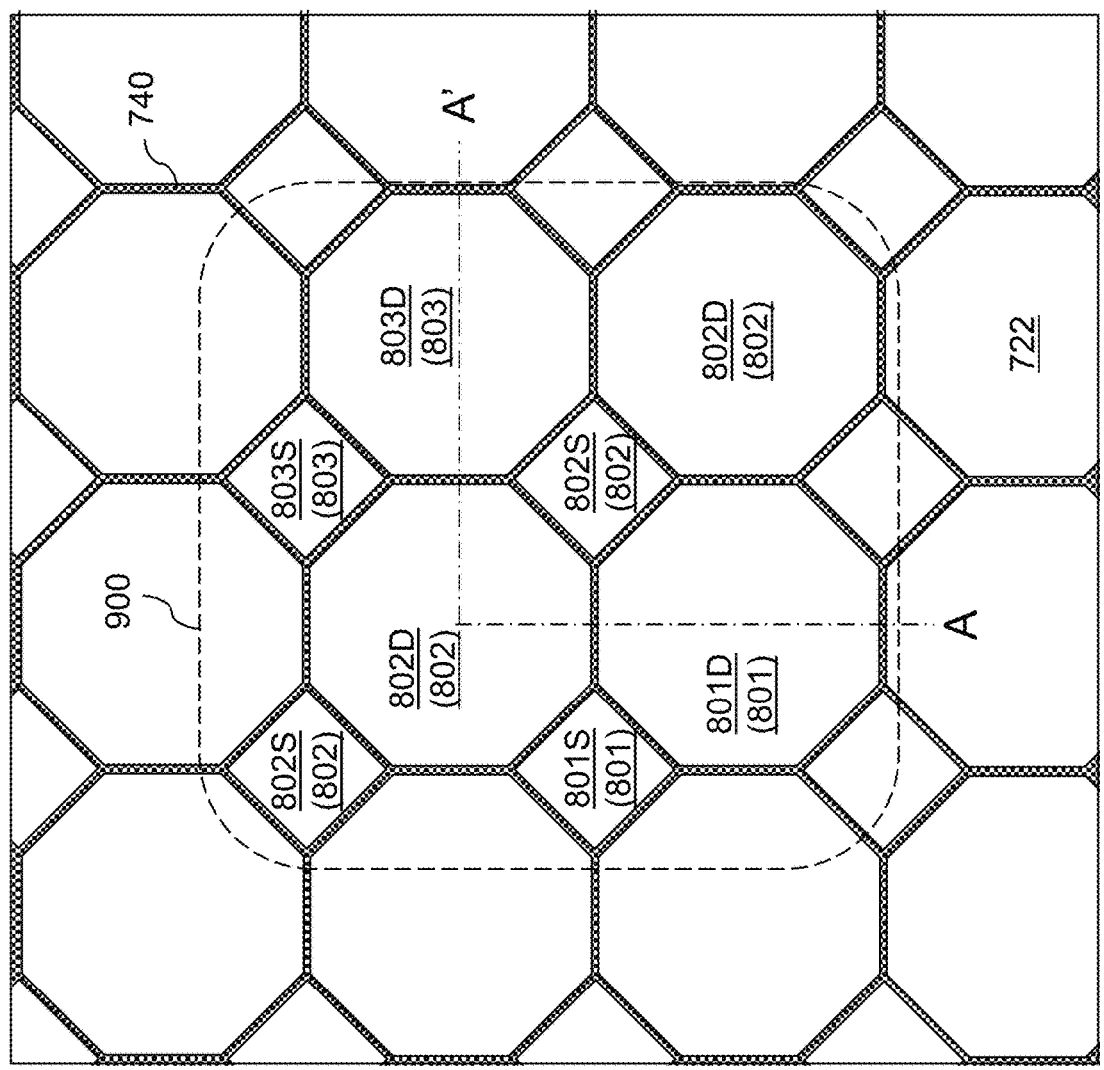
FIG. 9B is a plan view of the exemplary structure of FIG. 9A. The hinged vertical plane A-A' corresponds to the plane of the vertical cross-sectional view of FIG. 8A.

Referring to FIGS. 9A and 9B, a grid structure 740 may be formed over the horizontally-extending portion of the dielectric isolation layer 722. For example, a layer stack including a dielectric grid material layer and a metallic reflective material layer may be sequentially formed over the horizontally-extending portion of the dielectric isolation layer 722. The dielectric grid material layer may include a dielectric material such as silicon oxide, a porous dielectric material, polyimide, or another dielectric material. The thickness of the dielectric grid material layer may be in a range from 50 nm to 500 nm, although lesser and greater thicknesses may also be used. The metallic reflective material layer may include a metallic material that may provide high reflectivity. For example, the metallic reflective material layer may include silver, aluminum, copper, gold, or any other highly reflective metallic material. The thickness of the metallic reflective material layer may be in a range from 50 nm to 500 nm, although lesser and greater thicknesses may also be used.

A photoresist layer (not shown) may be applied over the metallic reflective material layer, and may be lithographically patterned to form openings within areas of the second-conductivity-type pinned photodiode layers 602, i.e., within the areas of the photodetectors that include a respective p-n junction between the second-conductivity-type pinned photodiode layers 602 and the first-conductivity-type wells 607. The areas of the transistors of the sensing circuit (such as the reset transistors 640, the source-follower transistors 650, and the select transistors 660) may, or may not, be covered by the photoresist layer.

Portions of the dielectric grid material layer and the metallic reflective material layer that are not masked by the patterned portions of the photoresist layer may be etched to form openings therethrough. Remaining portions of the dielectric grid material layer form a dielectric grid structure 742, and remaining portions of the metallic reflective material layer form a metallic grid structure 744. The stack of the dielectric grid structure 742 and the metallic grid structure 744 constitutes the grid structure 740.

The grid structure 740 may overlie peripheries of the second-conductivity-type pinned photodiode layers 602, and define a light collection area for each photodetector located within a respective subpixel 800. A pixel 900 may include a set of subpixels configured to detect light at different wavelengths. Each pixel 900 may be located within a respective pixel region, which includes a set of subpixels 800. For example, a pixel 900 may include at least one instance of a first subpixel 801, at least one instance of a second subpixel 802, and at least one instance of a third subpixel 803. In the illustrated example, a pixel may include a first subpixel 801 (such as a green subpixel) located in a first subpixel region, two second subpixels 802 (such as two red subpixels) located in two second subpixel regions, and a third subpixel 803 (such as a blue subpixel) located in a third subpixel region. Generally, a pixel 900 may include various combinations of at least two types of subpixels 800 configured to detect light at different wavelength ranges. Alternatively, an image sensor may be a monochromatic image sensor including a single type of subpixels 800. In this case, each pixel 900 may include only a single subpixel 800.

The grid structure 740 may divide each subpixel 800 into a detector region and a sensing circuit region. For example, a first subpixel 801 may include a first detector region 801D that overlies the second-conductivity-type pinned photodiode layer 602 of the first subpixel 801, and a first sensing circuit region 801S that overlies the sensing circuit (640, 650, 660) of the first subpixel 801. A second subpixel 802 may include a second detector region 802D that overlies the second-conductivity-type pinned photodiode layer 602 of the second subpixel 802, and a second sensing circuit region 802S that overlies the sensing circuit (640, 650, 660) of the second subpixel 802. A third subpixel 803 may include a third detector region 803D that overlies the second-conductivity-type pinned photodiode layer 602 of the third subpixel 803, and a third sensing circuit region 803S that overlies the sensing circuit (640, 650, 660) of the third subpixel 803. Generally, the set of all subpixels 800 within a pixel 900 may be arranged in any pattern that is conducive to periodic repetition of the pixels 900 within an array 1000 of pixels 900.

Figure 10:
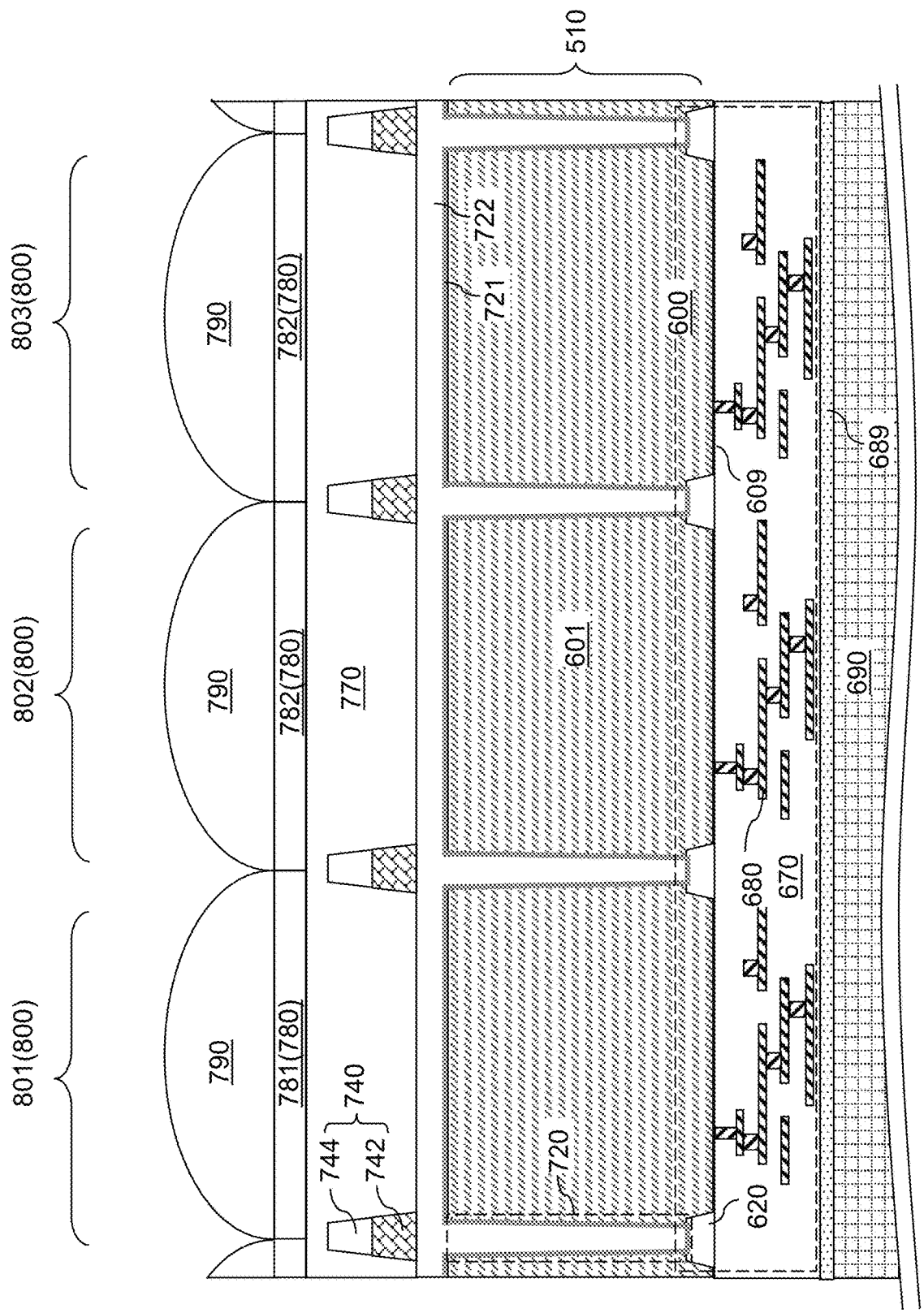
FIG. 10 is a vertical cross-sectional view of the exemplary structure after formation of a planarization dielectric layer, color filters, and lenses according to an embodiment of the present disclosure.

Referring to FIG. 10, a planarization dielectric layer 770 having a planar top surface may be formed over the grid structure. The planarization dielectric layer 770 may be formed by depositing a self-planarizing dielectric material such as flowable oxide (FOX). Alternatively, a transparent dielectric material may be deposited and planarized, for example, by chemical mechanical planarization to provide the planarization dielectric layer 770.

Various color filtering materials may be applied over the planarization dielectric layer 770, and may be patterned to form various color filters 780. The color filters 780 may include first-type color filters 781 formed within the regions of the first subpixels 801, second-type color filters 782 formed within the regions of the second subpixels 802, and third-type cooler filters 783 formed within the regions of the third subpixels 803. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Generally, a grid structure 740 may overlie the backside surface 709 of the semiconductor substrate 510, and may have an array of openings within areas of a respective one of the subpixels (i.e., within a respective subpixel region 800). An array of color filters 780 may overlie the grid structure 740, and an array of lenses 790 may overlie the array of color filters 780.

Figure 11:
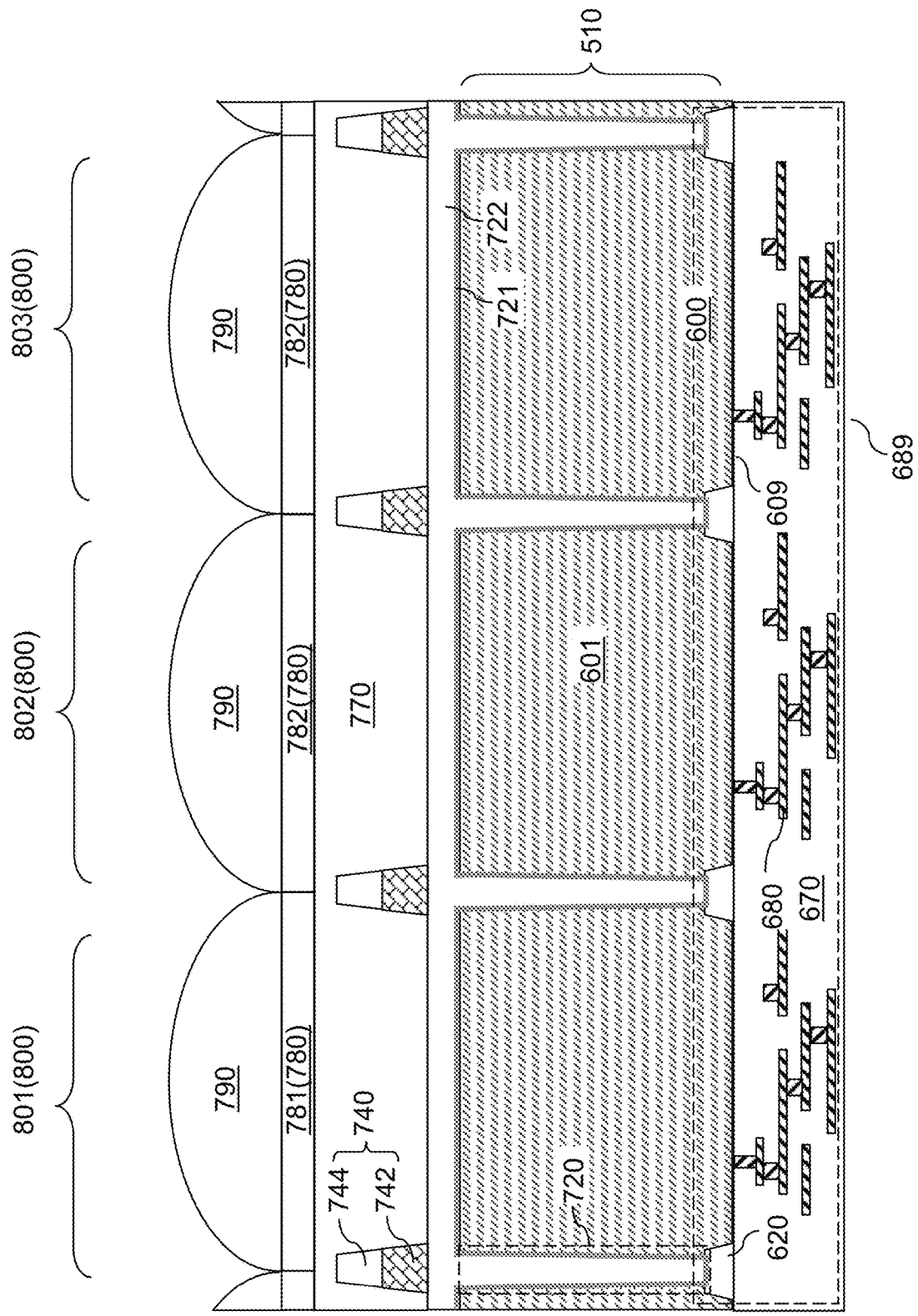
FIG. 11 is a vertical cross-sectional view of the exemplary structure after removal of the carrier substrate according to an embodiment of the present disclosure.

Referring to FIG. 11, the carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Figure 12:
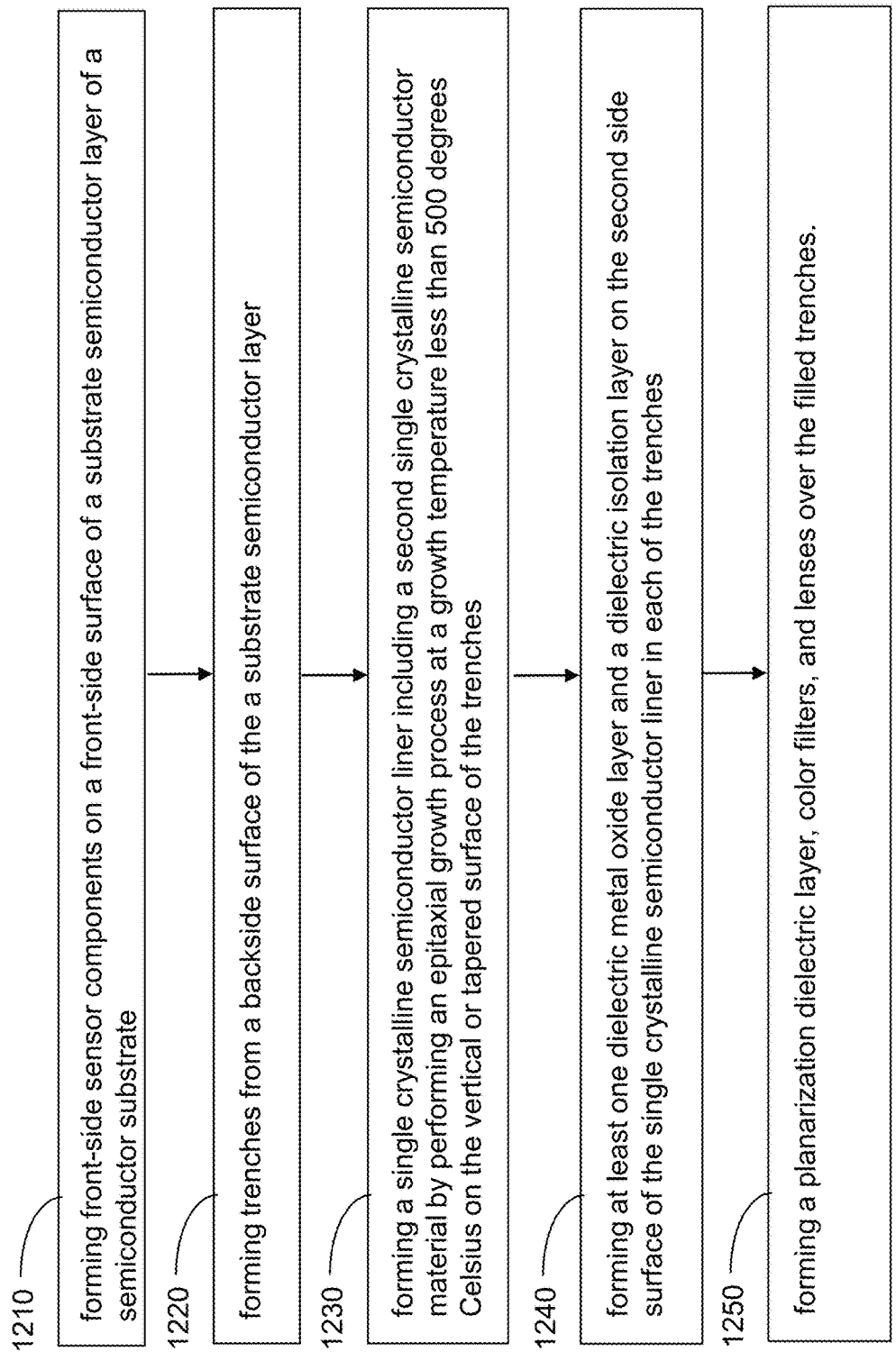
FIG. 12 is a flow chart for an exemplary process sequence for forming an image sensor according to an embodiment of the present disclosure.

Referring to FIG. 12 and the preceding drawings of the present disclosure, a general method of forming a semiconductor structure is provided according to an embodiment of the present disclosure. Referring to step 1210, front-side sensor components may be formed on a front-side surface of a substrate semiconductor layer 601 of a semiconductor substrate 510. Referring to step 1220, trenches 719 may be formed in a substrate semiconductor layer 601 of a semiconductor substrate 510. A sidewall of each trench 719 comprises a vertical or tapered surface with a first root-mean-square surface roughness greater than 0.5 nm. Referring to step 1230, a single crystalline semiconductor liner 661 including a second single crystalline semiconductor material may be formed by performing an epitaxial growth process at a growth temperature less than 500 degrees Celsius on the vertical or tapered surface of the trench 719. The single crystalline semiconductor liner 661 contains a vertically-extending portion that has a first side surface that contacts the vertical or tapered surface on a first side and a second side surface with a second root-mean-square surface roughness less than 0.5 nm. Referring to step 1240, at least one dielectric metal oxide liner 721 and a dielectric isolation layer 722 may be formed on the second side surface of the single crystalline semiconductor liner 661 in each of the trenches 719. The at least one dielectric metal oxide liner 721 may have a uniform thickness and may have a non-stoichiometric oxygen-rich composition that traps negative charges therein. The single crystalline semiconductor liner 661 may enhance the uniformity of the negative charges in the at least one dielectric metal oxide liner 721 by reducing compositional variations and thickness variations in the at least one dielectric metal oxide liner 721. Referring to step 1250, a planarization dielectric layer 770, color filters 780, and lenses 790 can be formed over the filled trenches 719.

Figure 13A:
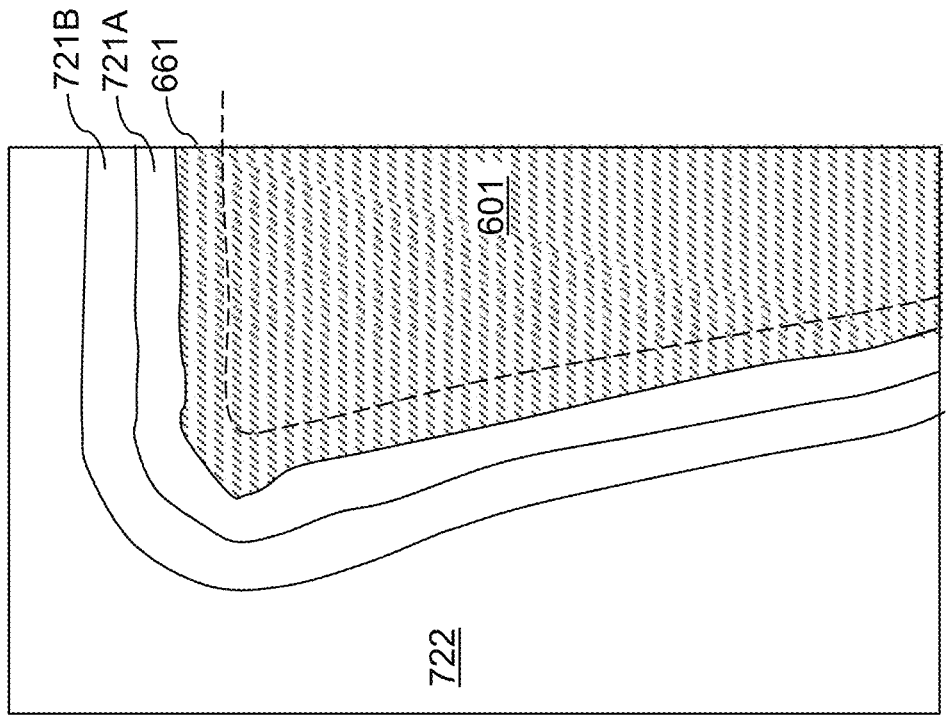
FIG. 13A is a schematic vertical cross-sectional view of a comparative exemplary test sample including a trench formed in a semiconductor substrate and two dielectric metal oxide liners formed on a sidewall of the trench.

Referring to FIG. 13A, a schematic vertical cross-sectional view of a comparative exemplary test sample illustrates a deep trench formed in a semiconductor substrate. Due to the reactive ion etch damages, an interface between a substrate semiconductor layer 601 and two dielectric metal oxide liners (721A, 721B) shows a root-mean-square surface roughness greater than 1 nm. A chromium layer 910 and a silicon oxide layer 920 were subsequently deposited to provide contrast among various layers in the schematic vertical cross-sectional view of FIG. 13A.

Figure 13B:
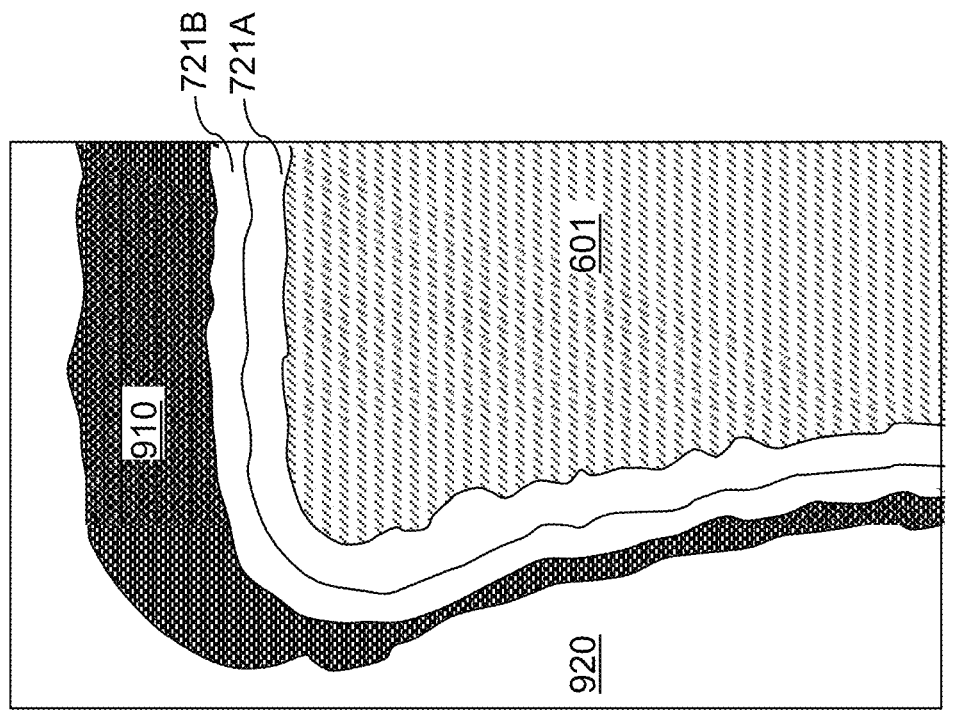
FIG. 13B is a schematic vertical cross-sectional view of a test sample including a trench formed in a semiconductor substrate, a single crystalline semiconductor liner formed using a low temperature epitaxy process, and two dielectric metal oxide liners formed on a sidewall of the trench according to an embodiment of the present disclosure.

Referring to FIG. 13B, a schematic vertical cross-sectional view of a test sample according to an embodiment of the present disclosure is shown. A deep trench 719 is formed in a semiconductor substrate including a substrate semiconductor layer 601. A single crystalline semiconductor liner 661 was formed using a low temperature epitaxy process as described above. Two dielectric metal oxide liners (721A, 721B) were subsequently formed on a sidewall of the deep trench. A dielectric isolation layer 722 including silicon oxide was subsequently deposited on the two dielectric metal oxide liners (721A, 721B). The two dielectric metal oxide liners (721A, 721B) show a flat interface with the single crystalline semiconductor liner 661 with a root-mean-square surface roughness less than 0.5 nm, such as less than 0.3 nm. Further, the sidewall surfaces of the single crystalline semiconductor liner 661 in FIG. 13B show much less defects and surface topographic features compared to the sidewall surfaces of the substrate semiconductor layer 601 in FIG. 13A. In addition, the surfaces of the single crystalline semiconductor liner 661 in FIG. 13B are along straight lines, which are along crystallographic planes of the single crystalline material of the single crystalline semiconductor liner 661. As a consequence of a superior surface quality of the sidewall of the single crystalline semiconductor liner 661 in FIG. 13B relative to the surface quality of the sidewall of the substrate semiconductor layer 601 in FIG. 13A, the first dielectric metal oxide liner 721A in FIG. 13B shows a much more uniform film thickness distribution and a significantly reduced surface roughness compared to the first dielectric metal oxide liner 721A in FIG. 13A. An image sensor incorporating the structure of FIG. 13B has superior dark current and white pixel performance relative to a comparative exemplary image sensor that does not incorporate a single crystalline semiconductor liner 661 of the present disclosure.

Referring to all drawings and according to various embodiments of the present disclosure, a semiconductor structure is provided, which comprises a semiconductor substrate 510 including a substrate semiconductor layer 601 having a first planar surface (such as a front surface 609) and a second planar surface (such as a backside surface 709) that is parallel to the first planar surface and containing a trench 719 that extends from the second planar surface toward the first planar surface, wherein a first single crystalline semiconductor material of the substrate semiconductor layer 601 has a vertical or tapered surface with a first root-mean-square surface roughness greater than 0.5 nm at a sidewall of the trench. The semiconductor structure comprises a single crystalline semiconductor liner 661 including a second single crystalline semiconductor material containing a vertically-extending portion that has a first side surface that contacts the vertical or tapered surface on a first side and a second side surface with a second root-mean-square surface roughness less than 0.5 nm. At least one dielectric metal oxide liner 721 may be located on the second side surface of the single crystalline semiconductor liner 661.

According to another aspect of the present disclosure, an image sensor is provided, which comprises: an array 1000 of pixels (900) located on a semiconductor substrate 510 including a substrate semiconductor layer (601), wherein each pixel 900 within the array 1000 of pixels comprises at least one subpixel 800, and each subpixel 800 comprise a respective photodetector 630 and a respective sensing circuit (640, 650, 660) located on a front surface of the semiconductor substrate 510; a plurality of trenches 719 that extends from a backside surface 709 of the semiconductor substrate 510 toward the front surface 609 at boundaries between neighboring pairs of the subpixels, wherein a first single crystalline semiconductor material of the substrate semiconductor layer 601 has a vertical or tapered surface with a first root-mean-square surface roughness greater than 0.5 nm at a sidewall of a trench of the plurality of trenches; a single crystalline semiconductor liner 661 including a second single crystalline semiconductor material containing a vertically-extending portion that has a first side surface that contacts the vertical or tapered surface on a first side and a second side surface with a second root-mean-square surface roughness less than 0.5 nm; and at least one dielectric metal oxide liner 721 located on the second side surface of the single crystalline semiconductor liner 661.

According to another aspect of the present disclosure, a method of forming a semiconductor structure is provided, wherein the semiconductor structure may be formed by forming a trench 719 in a substrate semiconductor layer 601 of a semiconductor substrate 510, wherein a sidewall of the trench 719 comprises a vertical or tapered surface with a first root-mean-square surface roughness greater than 0.5 nm. A single crystalline semiconductor liner 661 including a second single crystalline semiconductor material may be formed by performing an epitaxial growth process at a growth temperature less than 500 degrees Celsius on the vertical or tapered surface of the trench 719, wherein the single crystalline semiconductor liner contains a vertically-extending portion that has a first side surface that contacts the vertical or tapered surface on a first side and a second side surface with a second root-mean-square surface roughness less than 0.5 nm. At least one dielectric metal oxide liner 721 may be formed on the second side surface of the single crystalline semiconductor liner 661.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising: a semiconductor substrate including a substrate semiconductor layer having a first planar surface and a second planar surface that is parallel to the first planar surface and containing a trench that extends from the second planar surface toward the first planar surface, wherein a first single crystalline semiconductor material of the substrate semiconductor layer has a vertical or tapered surface with a first root-mean-square surface roughness greater than 0.5 nm at a sidewall of the trench; a single crystalline semiconductor liner including a second single crystalline semiconductor material containing a vertically-extending portion that has a first side surface that contacts the vertical or tapered surface on a first side and a second side surface with a second root-mean-square surface roughness less than 0.5 nm; and at least one dielectric metal oxide liner located on the second side surface of the single crystalline semiconductor liner.

2. The semiconductor structure of claim 1, wherein:
more than 50% of an entire surface area of the vertical or tapered surface comprises surface segments that do not contain faceted surfaces of the first single crystalline semiconductor material; and
more than 50% of an entire surface area of the second side surface of the second single crystalline semiconductor material comprises surface segments that are faceted surfaces of the second single crystalline semiconductor material.

3. The semiconductor structure of claim 1, wherein the at least one dielectric metal oxide liner comprises an aluminum oxide layer contacting the single crystalline semiconductor liner and having a thickness in a range from 0.8 nm to 1.6 nm, and having a root-mean-square thickness variation less than 0.1 nm.

4. The semiconductor structure of claim 1, wherein:
the at least dielectric metal oxide liner comprises at least one oxygen-rich dielectric metal oxide material and having a net negative charge; and
a silicon oxide material portion is located inside the trench and contacts a surface of the dielectric metal oxide liner.

5. The semiconductor structure of claim 1, wherein:
the single crystalline semiconductor liner has an average thickness in a range from 1.5 nm to 10 nm; and
the first root-mean-square surface roughness is at least three times the second root-mean-square surface roughness.

6. An image sensor comprising:
an array of pixels located on a semiconductor substrate including a substrate semiconductor layer, wherein each pixel within the array of pixels comprises at least one subpixel, and each subpixel comprise a respective photodetector and a respective sensing circuit located on a front surface of the semiconductor substrate;
a plurality of trenches that extends from a backside surface of the semiconductor substrate toward the front surface at boundaries between neighboring pairs of the subpixels, wherein a first single crystalline semiconductor material of the substrate semiconductor layer has a vertical or tapered surface with a first root-mean-square surface roughness greater than 0.5 nm at a sidewall of a trench of the plurality of trenches;
a single crystalline semiconductor liner including a second single crystalline semiconductor material containing a vertically-extending portion that has a first side surface that contacts the vertical or tapered surface on a first side and a second side surface with a second root-mean-square surface roughness less than 0.5 nm; and
at least one dielectric metal oxide liner located on the second side surface of the single crystalline semiconductor liner.

7. The image sensor of claim 6, wherein:
the substrate semiconductor layer has a p-type doping;
each photodetector comprises an n-doped pinned photodiode layer; and
the at least one dielectric metal oxide liner comprises at least one oxygen-rich dielectric metal oxide material and having a net negative charge.

8. The image sensor of claim 7, wherein the net negative charge has an areal density from $5.0 \times 10^9$ electrons per cm$^2$ to $1.0 \times 10^{14}$ electrons per cm$^2$.

9. The image sensor of claim 6, wherein:
the second single crystalline semiconductor material is epitaxially aligned to the first single crystalline semiconductor material; and
the first single crystalline semiconductor material and the second single crystalline semiconductor material have p-type doping; and
the second single crystalline semiconductor material has a lower atomic concentration of p-type dopants than a portion of the first single crystalline semiconductor material in contact with the second single crystalline semiconductor material.

10. The image sensor of claim 6, wherein:
the at least one dielectric metal oxide liner comprises an aluminum oxide layer contacting the single crystalline semiconductor liner and having a thickness in a range from 0.8 nm to 1.6 nm, and having a root-mean-square thickness variation less than 0.1 nm;
the at least dielectric metal oxide liner comprises an inner dielectric metal oxide liner including a dielectric metal oxide material having a dielectric constant greater than 7.9, having a material composition different from aluminum oxide, and contacting the aluminum oxide layer; and
a silicon oxide material portion is located inside the trench and contacts a surface of the inner dielectric metal oxide liner.

11. The image sensor of claim 6, wherein:
the single crystalline semiconductor liner has an average thickness in a range from 1.5 nm to 10 nm; and
the first root-mean-square surface roughness is at least three times the second root-mean-square surface roughness.

12. The image sensor of claim 6, wherein:
more than 50% of an entire surface area of the vertical or tapered surface comprises surface segments that do not contain faceted surfaces of the first single crystalline semiconductor material; and
more than 50% of an entire surface area of the second side surface of the second single crystalline semiconductor material comprises surface segments that are faceted surfaces of the second single crystalline semiconductor material.

13. The image sensor of claim 6, further comprising:
a grid structure overlying the backside surface of the semiconductor substrate and having an array of openings within areas of a respective one of the subpixels;
an array of color filters overlying the grid structure; and
an array of lenses that overlie the array of color filters.

14. An image sensor comprising:
an array of pixels located on a semiconductor substrate including a substrate semiconductor layer, wherein each pixel within the array of pixels comprises at least one subpixel, and each subpixel comprise a respective photodetector and a respective sensing circuit located on a front surface of the semiconductor substrate;
a plurality of trenches that extends from a backside surface of the semiconductor substrate toward the front surface at boundaries between neighboring pairs of the subpixels, wherein a first single crystalline semiconductor material of the substrate semiconductor layer has a vertical or tapered surface with a first root-mean-square surface roughness greater than 0.5 nm at a sidewall of a trench of the plurality of trenches;
a single crystalline semiconductor liner including a second single crystalline semiconductor material containing a vertically-extending portion that has a first side surface that contacts the vertical or tapered surface on a first side and a second side surface with a second root-mean-square surface roughness less than 0.5 nm; and
at least one dielectric metal oxide liner located on the second side surface of the single crystalline semiconductor liner, wherein the at least one dielectric metal oxide liner comprises an aluminum oxide layer contacting the single crystalline semiconductor liner and having a thickness in a range from 0.8 nm to 1.6 nm, and having a root-mean-square thickness variation less than 0.1 nm.

15. The image sensor of claim 14, wherein:
the substrate semiconductor layer has a p-type doping;
each photodetector comprises an n-doped pinned photodiode layer; and
the at least one dielectric metal oxide liner comprises at least one oxygen-rich dielectric metal oxide material and having a net negative charge.

16. The image sensor of claim 15, wherein the net negative charge has an areal density from $5.0 \times 10^9$ electrons per cm$^2$ to $1.0 \times 10^{14}$ electrons per cm$^2$.

17. The image sensor of claim 14, wherein:
the second single crystalline semiconductor material is epitaxially aligned to the first single crystalline semiconductor material; and
the first single crystalline semiconductor material and the second single crystalline semiconductor material have p-type doping; and
the second single crystalline semiconductor material has a lower atomic concentration of p-type dopants than a portion of the first single crystalline semiconductor material in contact with the second single crystalline semiconductor material.

18. The image sensor of claim 14, wherein:
the at least dielectric metal oxide liner comprises an inner dielectric metal oxide liner including a dielectric metal oxide material having a dielectric constant greater than 7.9, having a material composition different from aluminum oxide, and contacting the aluminum oxide layer; and
a silicon oxide material portion is located inside the trench and contacts a surface of the inner dielectric metal oxide liner.

19. The image sensor of claim 14, wherein:
more than 50% of an entire surface area of the vertical or tapered surface comprises surface segments that do not contain faceted surfaces of the first single crystalline semiconductor material; and
more than 50% of an entire surface area of the second side surface of the second single crystalline semiconductor material comprises surface segments that are faceted surfaces of the second single crystalline semiconductor material.

20. The image sensor of claim 14, further comprising:
a grid structure overlying the backside surface of the semiconductor substrate and having an array of openings within areas of a respective one of the subpixels;
an array of color filters overlying the grid structure; and
an array of lenses that overlie the array of color filters.

* * * * *